United States Patent
Sasaki et al.

(10) Patent No.: US 9,318,299 B2
(45) Date of Patent: Apr. 19, 2016

(54) CHARGED PARTICLE BEAM DEVICE HAVING AN ENERGY FILTER

(71) Applicant: Hitachi High-Technologies Corporation, Minato-ku, Tokyo (JP)

(72) Inventors: Yuko Sasaki, Tokyo (JP); Hiroyuki Ito, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/573,965

(22) Filed: Dec. 17, 2014

(65) Prior Publication Data

US 2015/0102221 A1 Apr. 16, 2015

Related U.S. Application Data

(63) Continuation of application No. 14/126,792, filed as application No. PCT/JP2012/002606 on Apr. 16, 2012, now Pat. No. 8,946,649.

(30) Foreign Application Priority Data

Jun. 16, 2011 (JP) ................................. 2011-133793

(51) Int. Cl.
*H01J 37/28* (2006.01)
*H01J 37/05* (2006.01)
(Continued)

(52) U.S. Cl.
CPC ............... *H01J 37/05* (2013.01); *H01J 37/244* (2013.01); *H01J 37/26* (2013.01); *H01J 37/263* (2013.01); *H01J 37/28* (2013.01); *H01J 2237/057* (2013.01); *H01J 2237/2446* (2013.01); *H01J 2237/2448* (2013.01);
(Continued)

(58) Field of Classification Search
CPC ......... H01J 37/28; H01J 37/244; H01J 37/09; H01J 37/147
USPC ............. 250/310, 311, 305, 307, 396 R, 397, 250/396 ML, 399
See application file for complete search history.

(56) References Cited

U.S. PATENT DOCUMENTS 5,528,034 A * 6/1996 Yamazaki et al. .............. 850/43
6,038,018 A 3/2000 Yamazaki et al.
(Continued)

FOREIGN PATENT DOCUMENTS

EP 1 100 112 A1 5/2001
JP 2001-167725 A 6/2001
(Continued)

OTHER PUBLICATIONS

International Search Report (PCT/ISA/210) with English translation dated Jul. 31, 2012 (Eight (8) pages).
(Continued)

*Primary Examiner* — David A Vanore
(74) *Attorney, Agent, or Firm* — Crowell & Moring LLP

(57) ABSTRACT

Provided is a charged particle beam device having an energy filter. In one embodiment, a charged particle beam device includes a deflector to deflect charged particles emitted from a sample to an energy filter, and a change in brightness value with the change of voltage applied to the energy filter is found for each of a plurality of deflection conditions for the deflector, and a deflection condition such that a change in the brightness value satisfies a predetermined condition is set as the deflection condition for the deflector.

4 Claims, 28 Drawing Sheets

(51) Int. Cl.
*H01J 37/147* (2006.01)
*H01J 37/244* (2006.01)
*H01J 37/26* (2006.01)

(52) U.S. Cl.
CPC .............. *H01J 2237/24485* (2013.01); *H01J 2237/2801* (2013.01); *H01J 2237/2806* (2013.01)

(56) References Cited

U.S. PATENT DOCUMENTS

| | | | |
|---|---|---|---|
| 6,066,849 A * | 5/2000 | Masnaghetti et al. | 250/310 |
| 6,091,249 A * | 7/2000 | Talbot et al. | 324/754.22 |
| 6,252,412 B1 * | 6/2001 | Talbot et al. | 324/754.22 |
| 6,444,981 B1 * | 9/2002 | Todokoro et al. | 250/310 |
| 6,570,163 B1 | 5/2003 | El Gomati et al. | |
| 6,730,907 B1 | 5/2004 | Feuerbaum et al. | |
| 6,797,955 B1 | 9/2004 | Adler et al. | |
| 6,847,038 B2 * | 1/2005 | Todokoro et al. | 850/9 |
| 6,979,824 B1 * | 12/2005 | Adler et al. | 850/9 |
| 7,135,677 B2 | 11/2006 | Kienzle et al. | |
| 7,714,287 B1 | 5/2010 | James et al. | |
| 7,745,782 B2 * | 6/2010 | Ishijima et al. | 250/305 |
| 7,947,951 B2 | 5/2011 | Khursheed | |
| 8,334,508 B1 | 12/2012 | Mankos | |
| 8,431,893 B2 | 4/2013 | Fukuda et al. | |
| 8,481,962 B2 * | 7/2013 | Kneedler | 250/397 |
| 8,592,776 B2 | 11/2013 | Enyama et al. | |
| 8,624,186 B2 * | 1/2014 | Wang et al. | 250/310 |
| 8,890,068 B2 * | 11/2014 | Kasai et al. | 250/310 |
| 8,946,649 B2 * | 2/2015 | Sasaki et al. | 250/396 R |
| 2001/0025929 A1 * | 10/2001 | Nakasuji | 250/399 |
| 2004/0084621 A1 | 5/2004 | Kienzle et al. | |
| 2006/0226361 A1 | 10/2006 | Frosien et al. | |
| 2009/0200463 A1 | 8/2009 | Degenhardt et al. | |
| 2010/0065753 A1 | 3/2010 | Enyama et al. | |
| 2011/0139983 A1 | 6/2011 | Doi | |
| 2011/0163229 A1 | 7/2011 | Frosien et al. | |
| 2012/0006997 A1 | 1/2012 | Frosien | |
| 2012/0119087 A1 * | 5/2012 | Takahashi | H01J 37/145 250/310 |
| 2012/0261574 A1 | 10/2012 | Fukuda et al. | |
| 2014/0001360 A1 * | 1/2014 | Kasai et al. | 250/307 |
| 2015/0014531 A1 * | 1/2015 | Yamazaki et al. | 250/311 |
| 2015/0034824 A1 * | 2/2015 | Mori et al. | 250/310 |

FOREIGN PATENT DOCUMENTS

| | | |
|---|---|---|
| JP | 2001-357808 A | 12/2001 |
| JP | 2002-524827 A | 8/2002 |
| JP | 2005-4995 A | 1/2005 |
| JP | 2006-261111 A | 9/2006 |
| JP | 2010-519698 A | 6/2010 |
| JP | 2012-3902 A | 1/2012 |
| WO | WO 2010/024105 A1 | 3/2010 |

OTHER PUBLICATIONS

Japanese Written Opinion (PCT/ISA/237) dated Jul. 31, 2012 (Five (5) pages).
Japanese language Office Action dated Jul. 29, 2014 (Two (2) pages).
Japanese Office Action issued in counterpart Japanese Application No. 2014-246402 dated Aug. 18, 2015 (two (2) pages).

* cited by examiner (a) Observation region of sample including two materials (b) Profile waveform when energy filtering is correctly performed (c) Profile waveform when energy filtering is not correctly performed (a)

(c)

(b)

CHARGED PARTICLE BEAM DEVICE HAVING AN ENERGY FILTER

CROSS REFERENCE TO RELATED APPLICATIONS

This application is a continuation of U.S. application Ser. No. 14/126,792, filed Dec. 16, 2013, which is a National Stage of PCT/2012/002606, filed Apr. 16, 2012, and claims priority from Japanese Patent Application No. 2011-133793, filed Jun. 16, 2011, the disclosures of which are expressly incorporated by reference herein.

TECHNICAL FIELD

The present invention relates to charged particle beam devices, and particularly relates to charged particle beam devices capable of selectively detecting charged particles having specific energy via an energy filter.

BACKGROUND ART

A Scanning Electron Microscope (SEM) as one of charged particle beam devices is a device to scan over a minute object as a sample with a narrow-focused electron beam so as to let the sample emit secondary electrons or the like, and to observe, examine or measure, for example, the minute object based on the secondary electrons or the like. An energy filter of a SEM is made up of a plurality of electrodes, among which electric field is formed to limit the passage of the secondary electrons or the like emitted from the sample, whereby the energy filter is used for selectively detecting electrons having specific energy. Patent Literature 1 describes a Wien filter to separate electrons emitted from a sample away from the optical axis and to introduce the electrons to a detector via an energy filter. Patent Literature 2 discloses a scanning electron microscope provided with a focusing element that focuses the trajectory of electrons emitted from a sample to correct the trajectory, thus achieving efficient detection of secondary electrons. Patent Literature 3 discloses a retarding field electrode arrangement that forms a potential barrier at an objective lens to retard particles emitted from a sample.

CITATION LIST

Patent Literatures

Patent Literature 1: JP 2002-524827 T or U.S. Pat. No. 6,066,849
Patent Literature 2: WO 2010/024105
Patent Literature 3: JP 2001-167725 A or EP 1100112 A1

SUMMARY OF INVENTION

Technical Problem

An energy filter is to let electrons having energy of a predetermined value or more pass therethrough selectively so as to acquire particular energy or signal information specific to electrons in a particular energy width. For instance, for selective detection of low-loss Backscattered Electrons (BSE), voltage (negative voltage) slightly larger than energy that secondary electrons (SEs) have is applied to a mesh electrode making up an energy filter, thus limiting the reach of secondary electrons or the like, contained a lot in electrons emitted from a sample, to a detector.

An energy filter typically includes a plurality of mesh electrodes provided with a plurality of apertures to permit the passage of electrons, and as a result of examination by the present inventors, it was found that energy resolution of the energy filter changes in some incident directions of electrons.

For instance, comparison is made between electrons that are incident from a direction close to the direction normal to a flat face of a plate-like body of a mesh electrode making up an energy filter and electrons that are incident from a direction at an acute angle to the flat face. The latter electrons are incident from a direction oblique to an equipotential plane of electric field that the energy filter forms. Such a difference in incident direction may change the energy resolution of the energy filter. The energy resolution is an index to indicate a variation in actual performance of an energy filter with reference to a setting condition of the energy filter. For instance, when an energy filter having an energy filter potential Vf actually transmits electrons having an energy of maximum value Vf+α, this means that the energy filter transmits extra amount of electrons by +α. On the other hand, in the case of Vf−α, this means that the energy filter does not transmit electrons that are supposed to pass through.

In this way, the energy resolution of an energy filter changes with the incident direction of electrons, and some incident directions may cause difficulty in observation, examination, measurement or the like to be performed. Patent Literatures 1 to 3 do not describe how to improve energy resolution of an energy filter in such a case.

The following describes a charged particle beam device to improve or maintain energy resolution of an energy filter.

Solution to Problem

In one embodiment to fulfill such an object, a charged particle beam device is proposed, which is configured to change a condition for an optical element to change an incident direction of charged particles to an energy filter, thereby detecting a signal that can be defined as a rating index of the energy resolution of the energy filter.

For instance, in one specific embodiment, a charged particle beam device includes a deflector to deflect charged particles emitted from a sample to an energy filter, and a change in brightness value with the change of voltage applied to the energy filter is found for each of a plurality of deflection conditions for the deflector, and a deflection condition such that a change in the brightness value satisfies a predetermined condition is set as the deflection condition for the deflector.

Advantageous Effects of Invention

Such a configuration can find a device condition for precise and stable operation of an energy filter, and enables a condition setting based on such a device condition.

DESCRIPTION OF EMBODIMENTS

The following description relates to a charged particle beam device, and particularly relates to a device to discriminate information that is acquired based on irradiation with a charged particle beam.

Charged particle beam devices include Scanning Electron Microscopes (SEMs) and Focused Ion Beam (FIB) devices. SEMs further include devices for special purposes, such as an electron microscope for measuring (Critical Dimension-SEM (CD-SEM)) and an electron microscope for review (review SEM) to observe defects, foreign substances or abnormal patterns in measurements found in an upstream inspection device in more details for analysis.

For observation, measurement or examination using these devices, information signals from a sample have to be detected by a detector effectively. More information signals mean improved image quality, which leads to improved throughput. When a detector is brought closer to the optical axis to improve the detection ratio or when voltage is applied to a detector to introduce information signals to the detector effectively, then a primary beam will be inevitably affected. It is also required for observation or examination to make a discrimination of information signals in accordance with a target to be observed, i.e., a target to be detected and to extract effective information only.

An energy filter is available as such a device to selectively extract effective information. The energy filter is a device to selectively transmit charged particles having specific energy out of charged particles emitted from a sample, and when charged particles of desired energy is to be detected, for example, the device generates electric field to limit the passage of charged particles of energy lower than the desired energy. The energy filter, for example, is made up of a plurality of mesh electrodes, and desired electric filed can be formed by controlling voltage applied to the electrodes.

Meanwhile, the performance of such an energy filter changes with an incident direction of charged particles. In other words, an appropriately set incident direction achieves high performance of the energy filter. The performance herein refers to energy resolution. The energy filter is a device to form electric field so as to reject some electrons when the electrons try to enter the energy filter, thus discriminating incident electrons by energy. In some incident directions (angles) of electrons to an equipotential plane of such electric field, energy of the electrons to be filtered may change. For instance, when electrons are incident from an acute direction to an equipotential plane, the electrons will receive a deflection action from a direction different from the incident direction, and so as compared with electrons incident perpendicularly to the equipotential plane, the upper limit of energy of electrons that can pass through the energy filter may be lowered.

Figure 22:
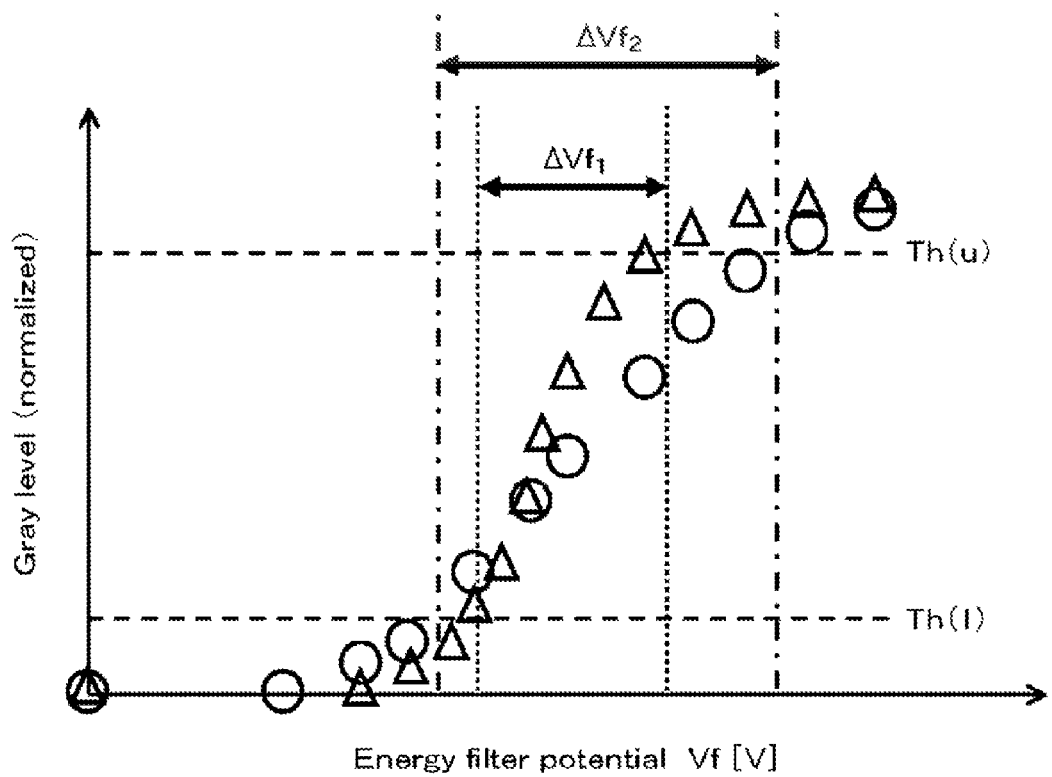
FIG. 22 shows a change in brightness with the change in voltage applied to an energy filter.

FIG. 22 is an exemplary graph where the horizontal axis represents voltage applied to an energy filter and the vertical axis represents brightness of a part irradiated with a beam. In the graph, triangles represent electrons incident to the energy filter from a first direction, and circles represent electrons incident to the energy filter from a second direction. As the voltage applied to the energy filter becomes gradually weak (toward right in FIG. 22), the amount of electrons detected by a detector increases. When the brightness changes sharply with a change of the applied voltage Vf [V], such an energy filter can be said to have high energy resolution. In the example of FIG. 22, variation of Vf yielding a change in brightness between two brightness thresholds (Th(u) and Th(l)) is $\Delta Vf_1$ for electrons in the first direction and $\Delta Vf_2$ for electrons in the second direction. That is, in the example of FIG. 22, the electrons incident from the first direction have higher energy resolution than that of the electrons incident from the second direction during energy filtering. In this way, a device condition to decrease $\Delta Vf$ may be found, whereby an energy filter condition can be found, having high energy resolution capable of clearly separating electrons to be transmitted and electrons to be limited in transmission.

Figure 1:
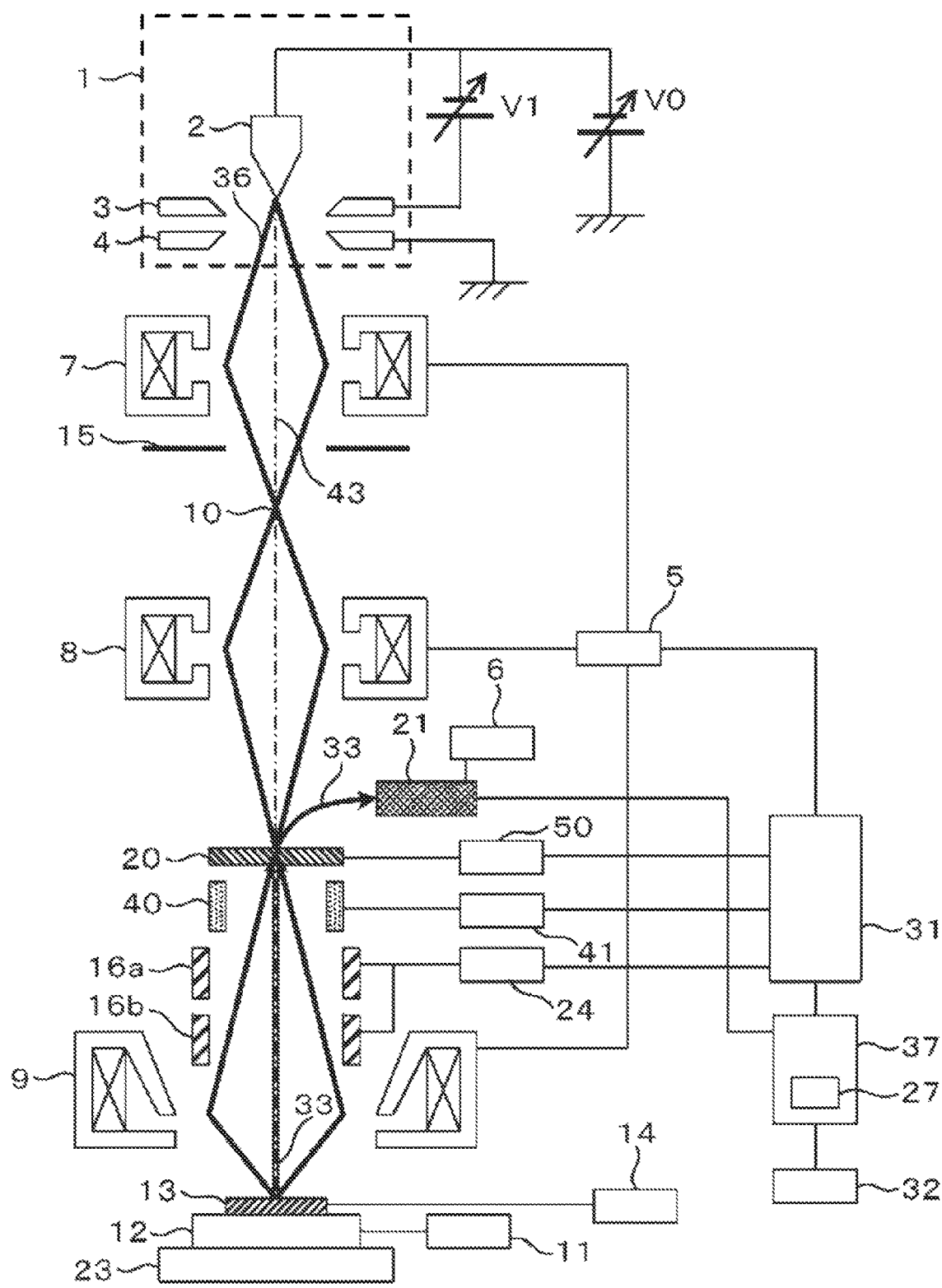
FIG. 1 is a schematic view of a charged particle beam device.

The following describes the outline of a SEM that is one embodiment of a charged particle beam device equipped with an energy filter, with reference to the drawings. FIG. 1 shows the overall view of a SEM that is one example of a charged particle beam device. The following exemplifies a scanning electron microscope, but not limited thereto, and the following examples can be applied to other charged particle beam devices as well.

In order to introduce information signals from a sample to a detector effectively, voltage is typically applied to the detector to generate attraction electric field to introduce the information signals. As a method to improve detection efficiency, such applied voltage may be increased or the detector may be brought closer to the optical axis, thus increasing the attraction electric field. On the contrary, influences of the attraction electric field on the primary beam pose a problem. The influences cause axis deviation of the primary beam or aberrations such as astigmatism, for example. That is, there is a trade-off relationship such that as the electric field is made stronger for effective detection of information signals, the influences on the primary beam become more significant.

Thus, it is desirable to use a detection system capable of decreasing the influences of the attraction electric field of a detector to detect information signals generated from a sample, while detecting the information signals effectively.

Then, the following describes, as one embodiment of an energy filter, an example where shield is arranged to prevent the influences of attraction electric field of a detector on the primary beam. The following further describes a configuration including a plurality of sheets of shield to be overlaid, and voltage is applied to any one sheet of the shield, thereby making discrimination by a signal from a sample having certain energy and by an emission angle from the sample, and other charged particle beam devices suitable for energy discrimination.

An electron gun 1 includes an electron source 2, an extraction electrode 3 and an acceleration electrode 4. Between the electron source 2 and the extraction electrode 3, extraction voltage V1 is applied, whereby an electron beam 36 is extracted from the electron source 2. The acceleration electrode 4 is kept at earth potential, and acceleration voltage V0 is applied between the acceleration electrode 4 and the electron source 2. Thus, the electron beam 36 is accelerated by this acceleration voltage V0.

The accelerated electron beam 36 is removed at an unnecessary region by an aperture 15, which is then focused by a focusing lens 7 and a focusing lens 8 connected to a lens control power supply 5. The electron beam is then focused to a sample 13 such as a semiconductor wafer on a sample stage 12 by an objective lens 9.

The sample stage 12 may be at least horizontally-movable by a stage driver 23. The sample 13 is irradiated with the focused electron beam 36, and is scanned by deflectors 16a, 16b connected to a scanning signal generator 24. At this time, an astigmatism corrector 40 is controlled by an astigmatism correction controller 45. Information signals 33 (secondary electrons and/or backscattered electrons) emitted from the sample 13 irradiated with the electron beam 36 are deflected by an orthogonal electromagnetic field deflector 20, and are detected by a detector 21. The detected information signals 33 may be a brightness modulation signal of an image display 32 such as a CRT, whereby an enlarged image of the sample 13 can be displayed on the image display 32. Although not illustrated, the thus described configuration is contained in a vacuum vessel suitable for irradiation of an electron beam. The lens control power supply 5, the scanning signal generator 24 and the astigmatism correction controller 41 are connected to a controller 31. The orthogonal electromagnetic field deflector 20 is controlled by an orthogonal electromagnetic controller 50 in accordance with an instruction from the controller 31. The orthogonal electromagnetic field deflector 20 includes an electrode that generates electric field to deflect the information signals 33 toward the detector 21 and a magnetic pole to generate magnetic field that is orthogonal to the electric field, where the magnetic field deflects a beam so as to compensate for the deflection action of the beam by the electric field.

Figure 2:
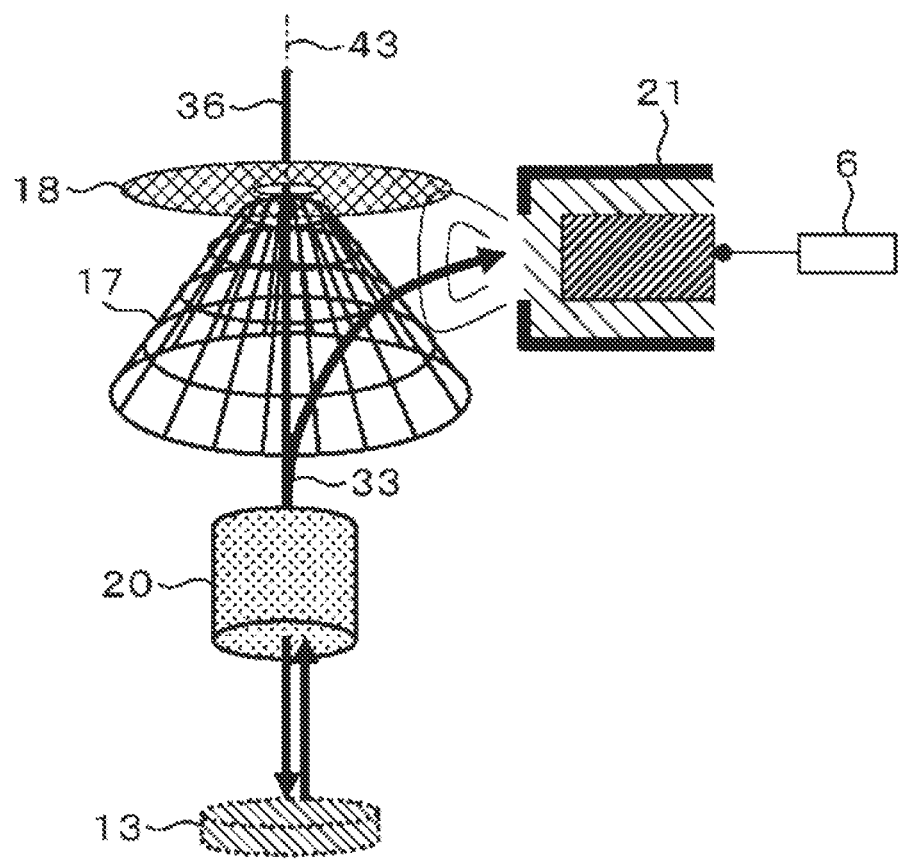
FIG. 2 shows a signal detection system in details.

FIG. 2 shows an example of the configuration from the orthogonal electromagnetic field deflector 20 to the detector 21 in details. An electrode 17 is placed along an optical axis 43 for shielding so that the electron beam 36 is not influenced by the electric field generated by voltage applied from an electric field controller 6 of the detector 21. In the example, the electrode 17 has a rotationally-symmetrical conical shape in the mesh form so as to transmit the information signals 33 easily.

Figure 3:
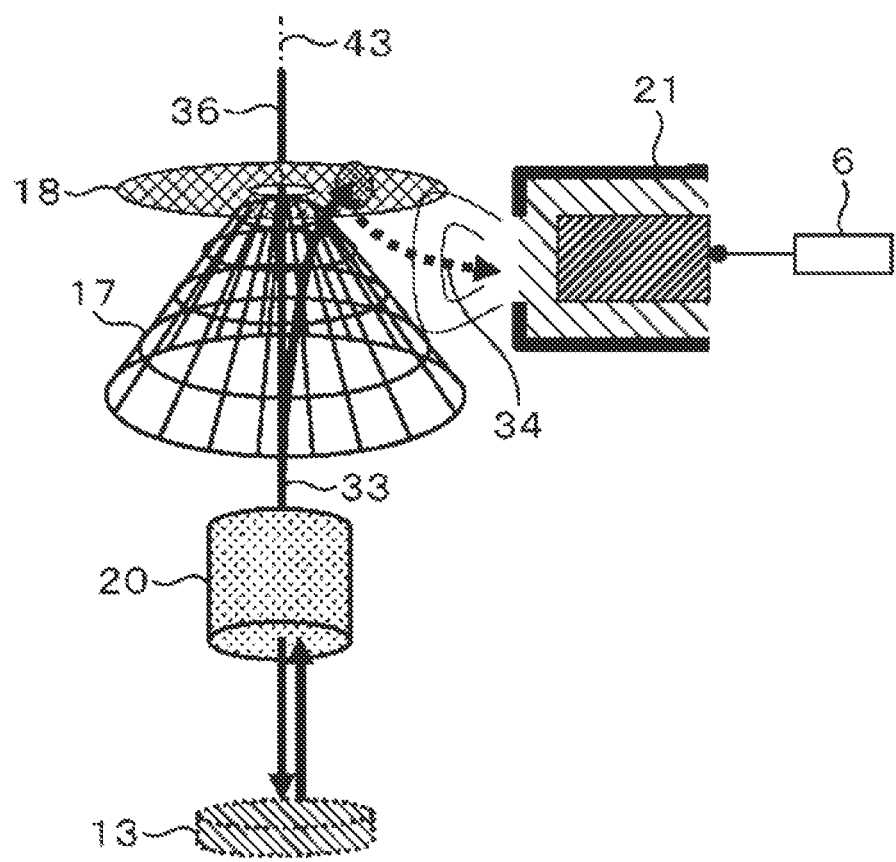
FIG. 3 shows a signal detection system including a reflection board (conversion electrode) in details.

The information signals 33 are deflected by the orthogonal electromagnetic field deflector 20 so as to allow the detector 21 to detect them directly, and in order to reduce the influences of aberration generated during the deflection, the amount of deflection of the information signals 33 may be made smaller in some cases. In this case, as shown in FIG. 3, the information signals 33 may be applied to an electrode (reflection board) 18 used as a reflection board once, and then second information signals 34 generated from the electrode (reflection board) 18 may be guided to the detector 21 by the attraction electric field of the detector 21.

The electrode 17 may be brought in close proximity with the electrode (reflection board) 18 or may be placed in contact therewith, thus suppressing the electric field from the detector 21 from leaking to the optical axis 43, i.e., the electron beam 36 becomes less influenced by the electric field of the detector 21. In this way, axis deviation and aberrations of the electron beam 36 can be suppressed.

Figure 4:
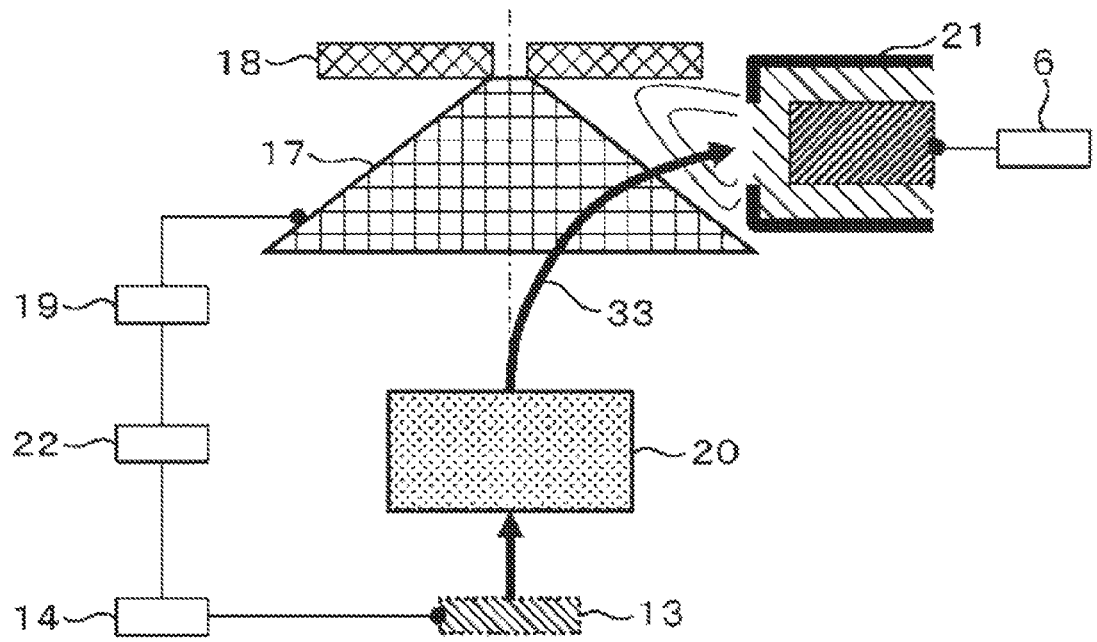
FIG. 4 shows a signal detection system in details.

The electrode 17 is typically at the earth potential, but as shown in FIG. 4, voltage may be applied to the electrode 17 so as to filter certain signals only of the information signals 33 from the sample 13. In this configuration, energy of the information signals 33 generated from the sample 13 that is not a detection target may be filtered, thus enabling discrimination of the information signals 33, so that an image can be formed of the information signals 33 with energy to be extracted. That is, an image formed with different energy can be acquired by changing voltage applied to the electrode 17 while scanning over the sample 13 with the deflectors 16.

Voltage applied to the electrode 17 is controlled by a controller 22 via a voltage controller 19. The controller 22 links to a variable deceleration power supply 14 to control the voltage applied to the sample 13, thus controlling the voltage controller 19. For instance, let that voltage applied to the sample 13 is Vr and energy of the information signals 33 to be filtered is e, then the voltage Vt applied to the electrode 17 is controlled based on the following equation (1):

[Math. 1]

$$Vt = e + Vr \quad (1)$$

When voltage Vr applied to the sample 13 is 1 kV and energy of the information signals 33 to be filtered is 100 eV, then voltage Vt applied to the electrode 17 may be set at 1.1 kV.

Figure 5:
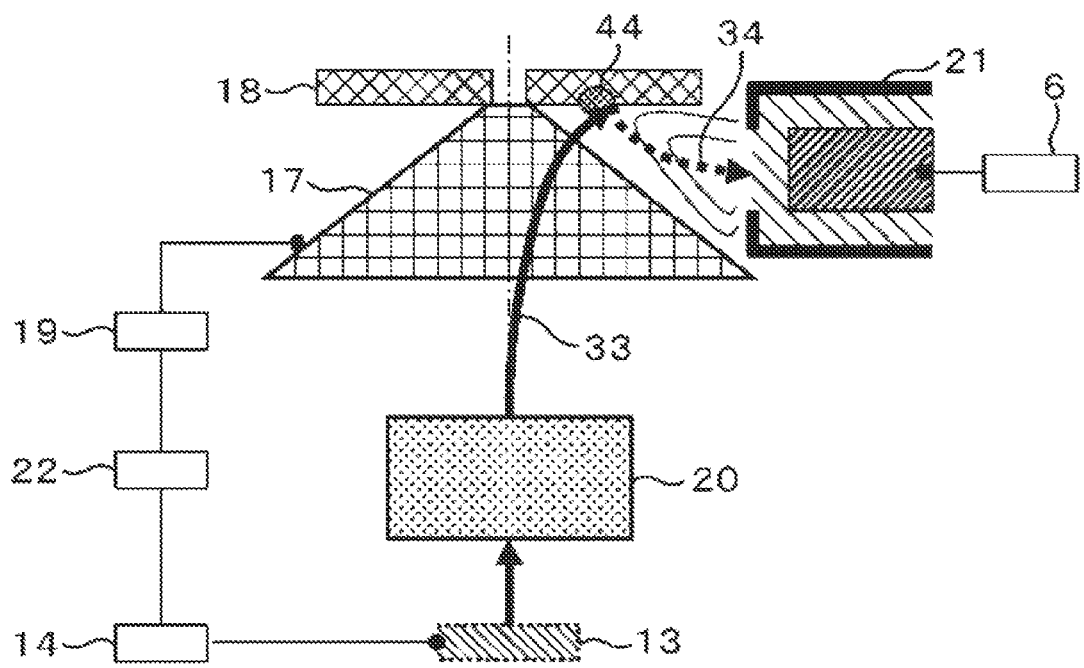
FIG. 5 shows a signal detection system including a reflection board in details.

FIG. 5 shows an example where information signals 33 are applied to the electrode (reflection board) 18, and second information signals 34 generated from the electrode (reflection board) 18 are detected by the detector 21. Control may be performed in a similar manner to FIG. 4.

Figure 6:
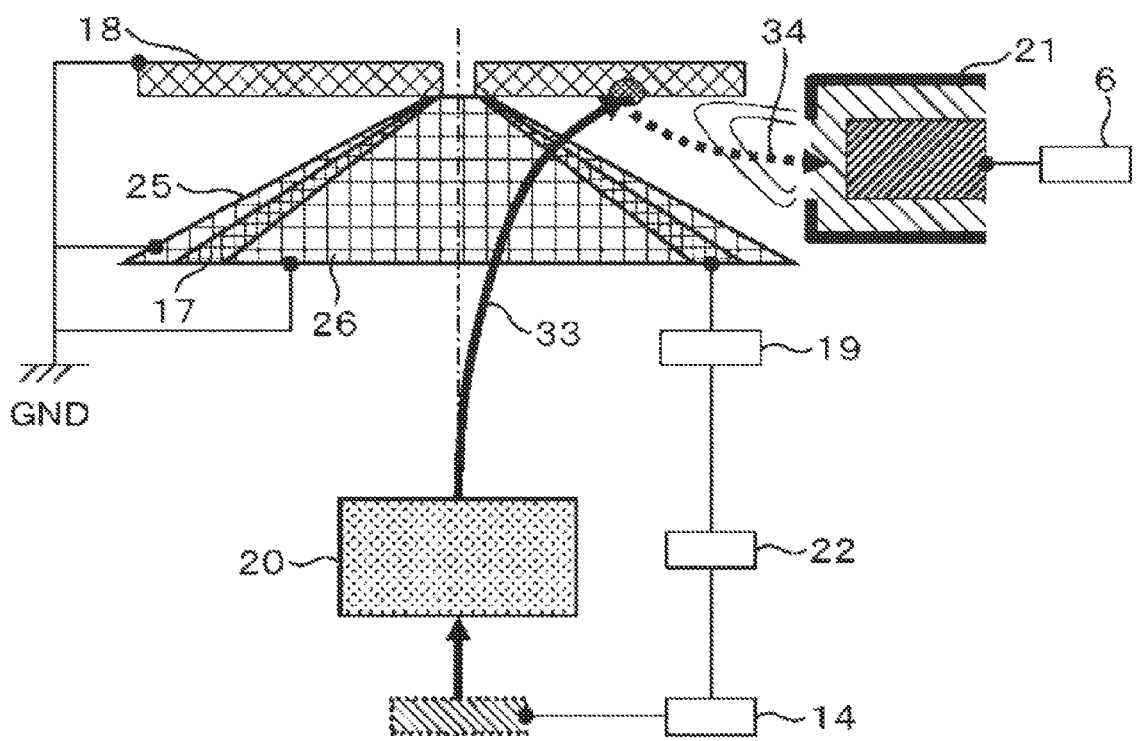
FIG. 6 shows a signal detection system including a plurality of electrodes and a reflection board in details.

FIG. 6 shows one example including a plurality of electrodes 17. FIG. 6 shows three electrodes as one example. The electrode 17 is sandwiched between an electrode 25 and an electrode 26, which are basically at the earth potential, to be a composite electrode. Unlike FIG. 4 and FIG. 5, the electric field of the electrode 17 is suppressed by the electrode 25 and the electrode 26 at the earth potential. This can therefore address a problem occurring when the electric field of the electrode 17 is strong. For instance, when the electric field is strong, a lens action that cannot be ignored occurs, which generates aberration of the primary beam and makes the beam blurred unfortunately. Such electric field may interfere with the attraction electric filed of the detector 21, which may change the trajectories of the information signals 33 and the information signals 34.

Figure 7:
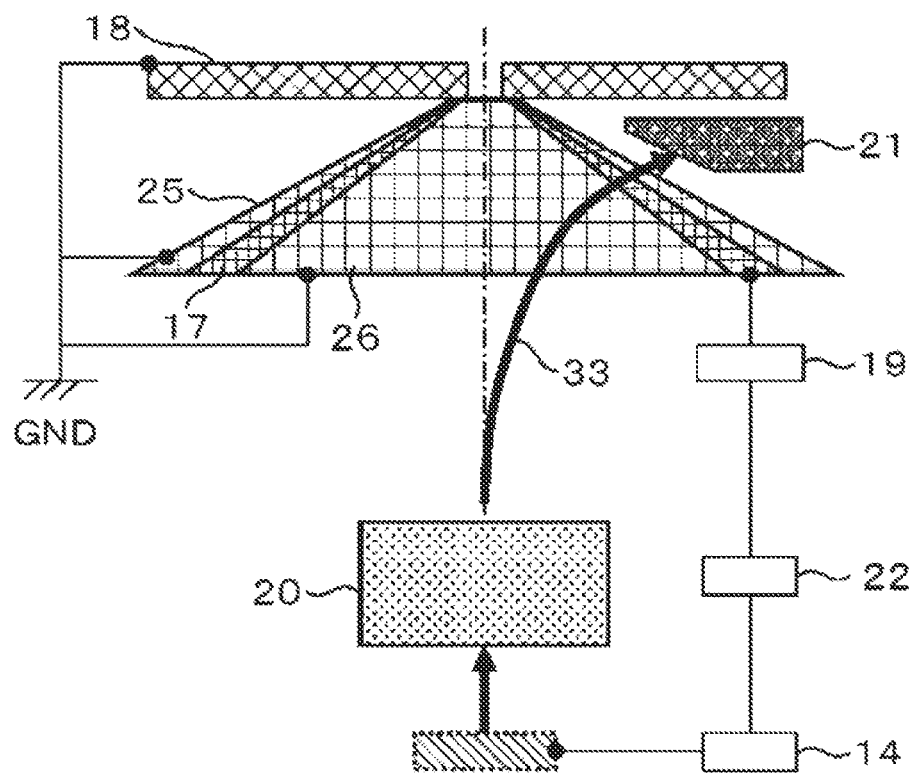
FIG. 7 shows a signal detection system including a plurality of electrodes in details.
Figure 8:
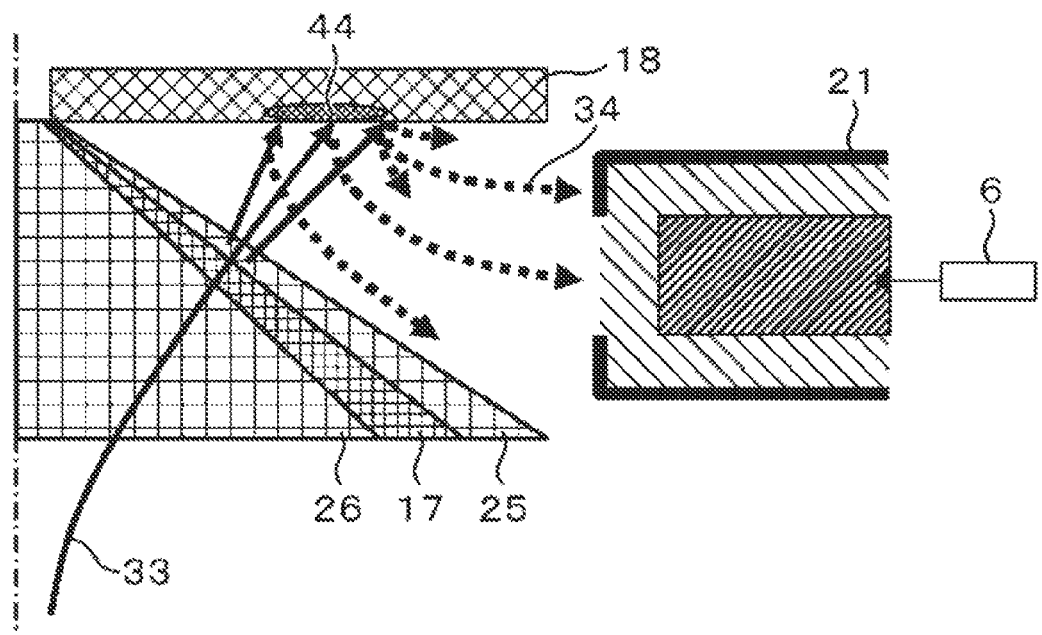
FIG. 8 shows the trajectory of signals (electrons) passing through an electrode.

FIG. 7 shows an example where information signals 33 passing through the composite electrode are not applied to the electrode 18, but are directly detected by the detector 21. As shown in FIG. 8, the information signals 33 passing through the composite electrode are subjected to a lens action in the electrode, so that the trajectory thereof changes with energy of the information signals 33 or the incident angle to the electrode 17. That is, the information signals 33 are applied to the electrode (reflection board) 18 to be spread over an area. Such an area 44 changes greatly with energy of the information signals 33 or voltage applied to the electrode 17. The second information signals 34 generated from the electrode (reflection board) 18 also emit therefrom with various angles or energy, and so a larger area 44 makes it difficult to detect all of the second information signals 34 generated from the area 44 by the detector 21. In that case, it is effective to detect the information signals 33 directly without applying them to the electrode (reflection board) 18 as shown in FIG. 7.

Figure 9:
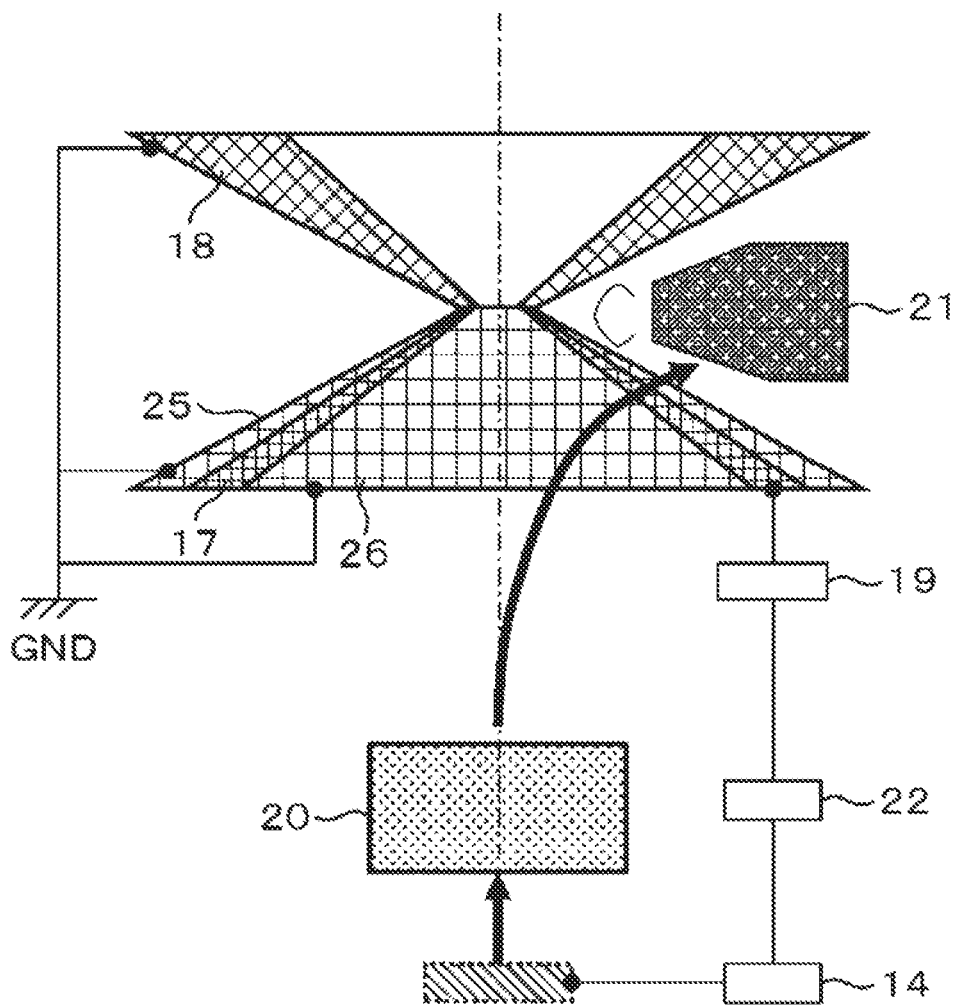
FIG. 9 shows a signal detection system including a plurality of electrodes in details.

FIG. 9 shows a conical-shaped electrode (reflection board) 18 so as to make the attraction electric field of the detector 21 uniform. This shape is applicable to both of the case of detecting the information signals 34 indirectly using the electrode 18 and the case of detecting the information signals 33 directly.

Figure 10:
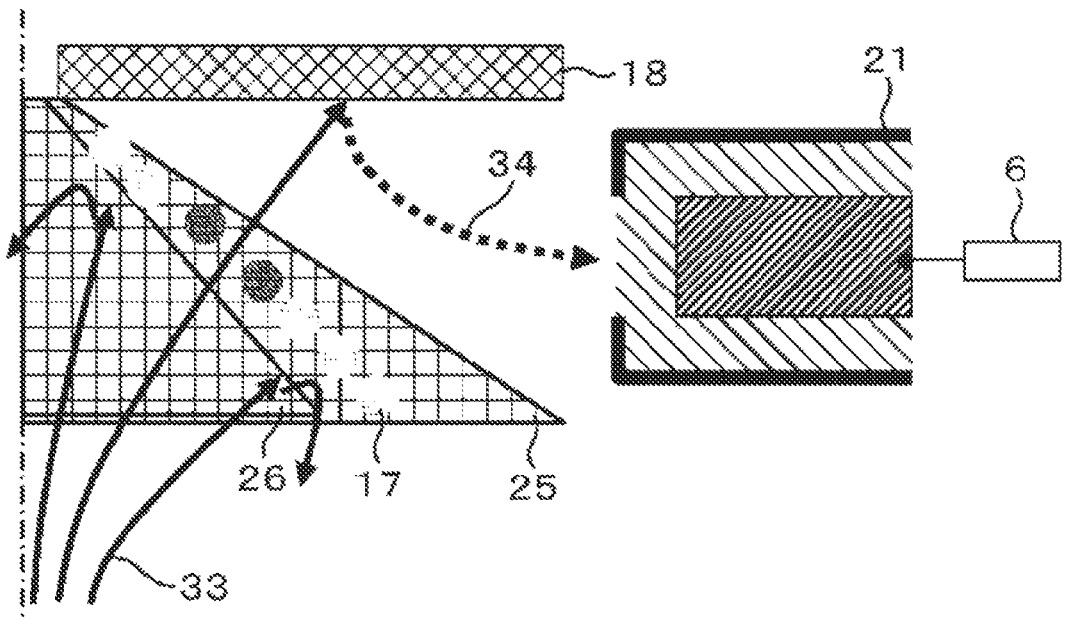
FIG. 10 shows a signal detection system including an annular electrode in details.
Figure 11:
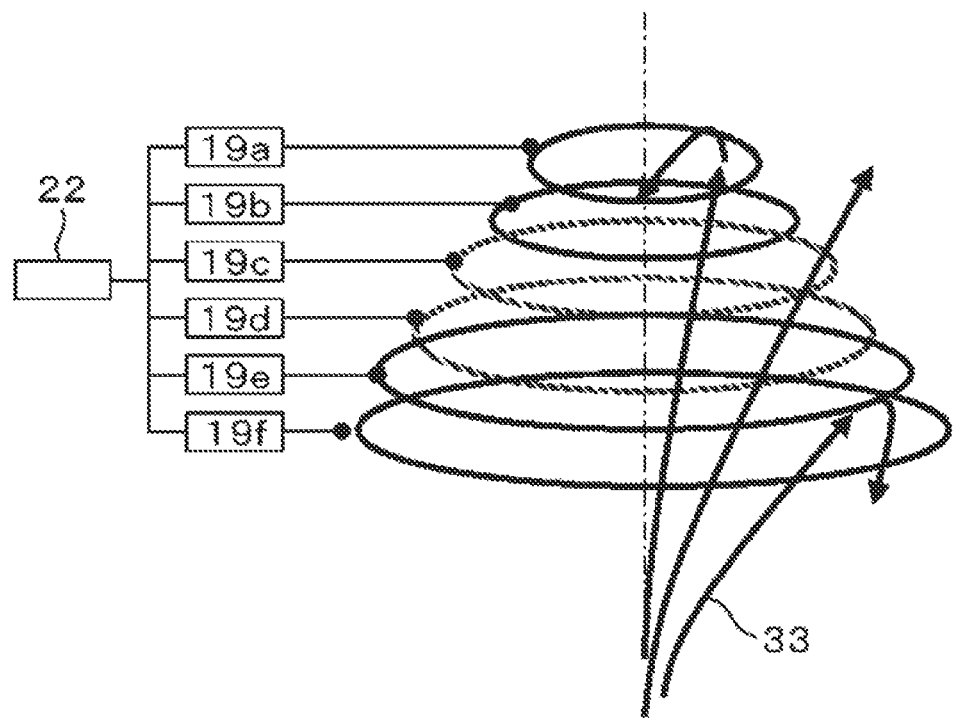
FIG. 11 shows the trajectory of signals passing through an annular electrode.

FIG. 10 shows an annular electrode 17 including a plurality of annular members so that voltage is applied to each annular member, whereby information signals 33 from the sample 13 can be discriminated. FIG. 11 shows one example of a plurality of annular electrodes 17. For instance, the example of FIG. 11 includes six annular electrodes, and voltage applied to each annular electrode is controlled by a voltage controller a to f. In one example, while voltage is applied to the voltage controllers 19a, 19b, 19e and 19f to filter information signals 33 of certain energy, voltage is applied to the voltage controllers 19c and 19d to transmit the information signals 33 or to be at the earth potential.

Since the trajectory of the information signals 33 will change with the emission angle from the sample 13, the configuration as in FIG. 11 enables discrimination of information signals 33 based on such a difference in trajectory.

Figure 12:
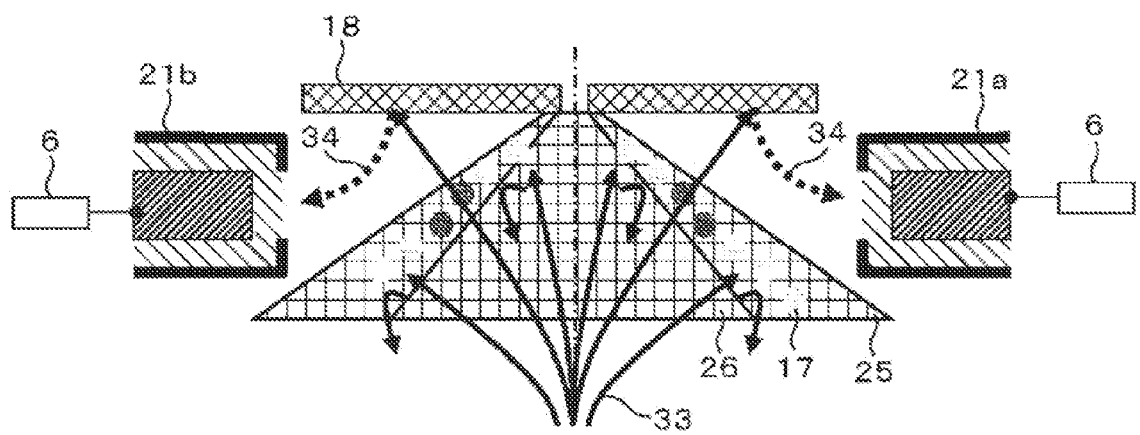
FIG. 12 shows the trajectory of signals passing through an annular electrode.

As in FIG. 12, when information signals 33 from the sample 13 are spread widely to enter the electrode 17, a plurality of detectors 21 may be provided for detection. For instance, information signals 33 emitted from the sample 13 can be discriminated with the electrode 17 without operating the orthogonal electromagnetic field deflector 20, and in this case, aberration occurring when the orthogonal electromagnetic field deflector 20 is operated can be suppressed, and so signal discrimination is enabled while keeping high resolution. Although not illustrated in the drawing, this configuration is also effective to the case of detecting information signals 33 directly as in FIG. 9.

Figure 13:
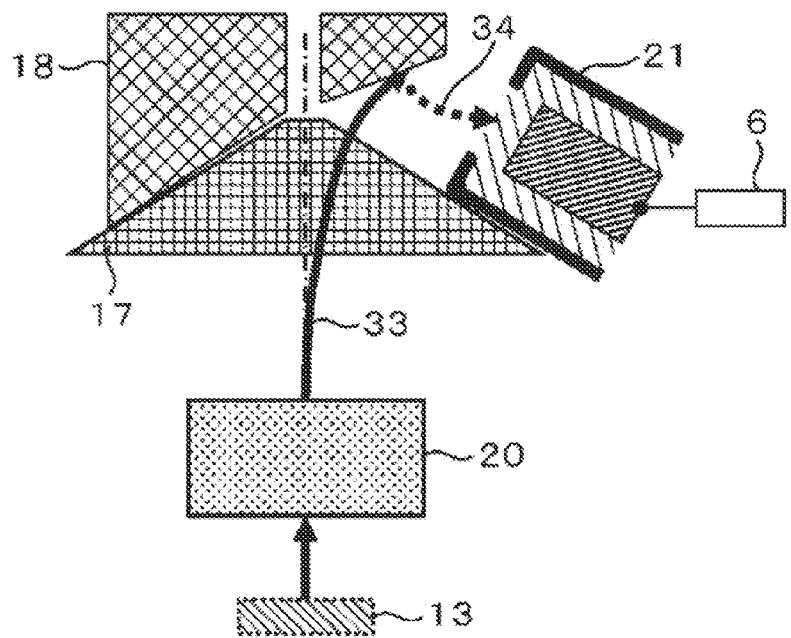
FIG. 13 shows a signal detection system in details.

FIG. 13 shows an exemplary configuration including an inclined electrode (reflection board) 18 as well as the detector 21 also being placed at an angle, thus generating second information signals 34 effectively from the electrode 18.

The energy filter illustrated in FIG. 2, for example, has a cross section (the shape viewed from the direction orthogonal to the electron beam passage) such that a distance from the electrode 18 becomes narrower gradually with increasing proximity to the electron beam passage. The energy filter is formed axisymmetrically about the electron beam passage.

Figure 35:
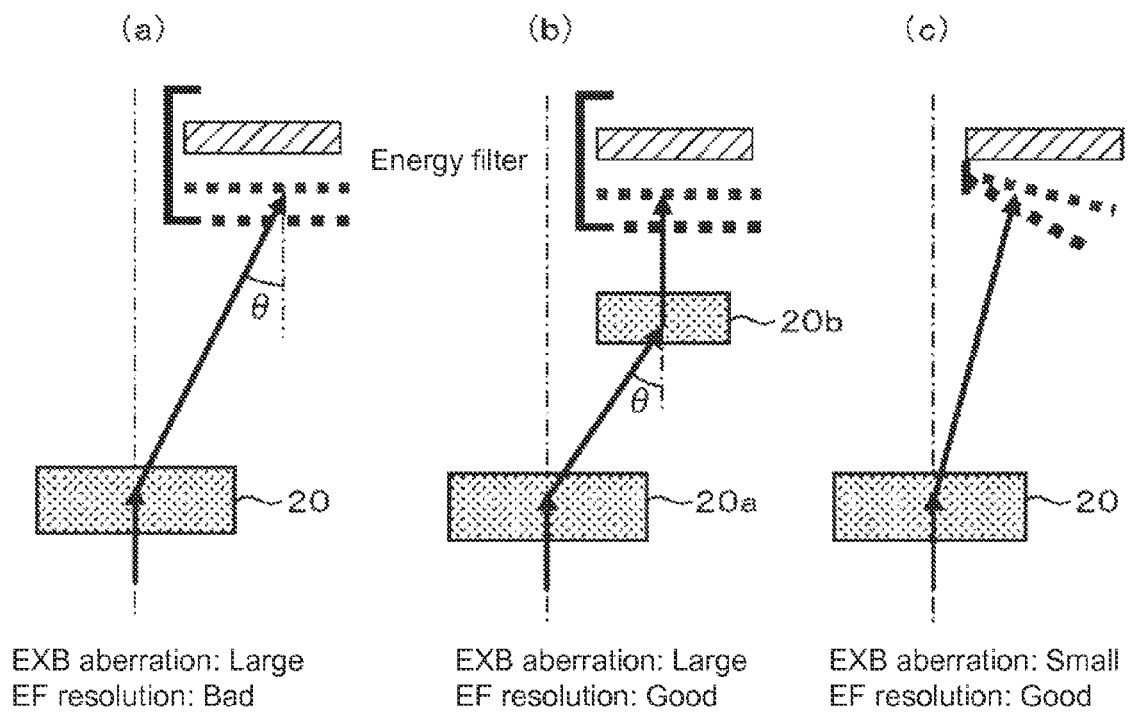
FIG. 35 describes the relationship among a shape of an energy filter, aberration and energy resolution.
Figure 35:
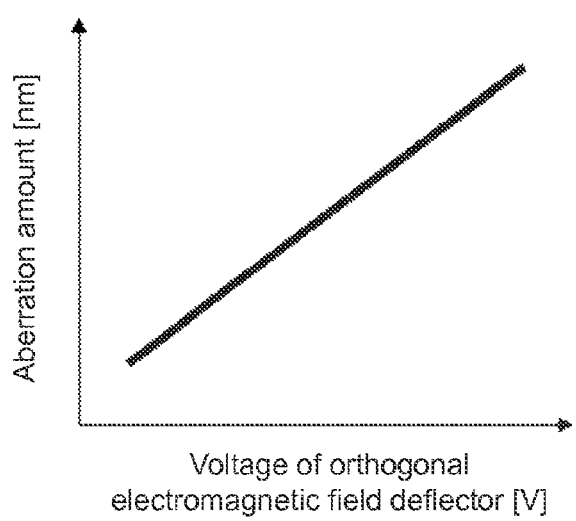

When an energy filter is placed parallel to a sample, information signals will be deflected by EXB and are incident to the energy filter at incident angle θ (FIG. 35(a)). Energy resolution deteriorates depending on the angle θ, and then a new EXB (20b) may be placed for vertically incident to the energy filter as in FIG. 35(b), which, however, leads to complex control. Of course, aberration occurring to operate the EXB is inevitable.

Then as in FIG. 35(c), a filter is inclined to minimize the bending angle θ by the EXB. Thereby, aberration occurring in operation of the EXB can be suppressed.

As illustrated in FIG. 6, for example, a mesh electrode may be configured so that the angle between the electrode 26 at the grounding potential and the electrode (this may be a detecting plane of the detector) 18 is an acute angle, whereby influences on a beam from the electric field formed by voltage applied to the electrode 17 can be suppressed without providing a tubular electrode 351 that is elongated in the optical axis direction as illustrated in FIGS. 35(a) and (b).

Contamination may be attached to the inside of a tubular electrode 315 due to collision of electrons passing therethrough, and if electric charge is accumulated at this contamination, the tubular electrode may have a deflection action. Since a longer tubular electrode increases the possibility of contamination attached, a shorter possible tubular electrode is desirable. On the other hand, when the diameter of the tubular electrode is increased so as to prevent attachment of contamination, the electrode 18 becomes accordingly away from the optical axis, resulting in the necessity to set a large deflection angle by the orthogonal electromagnetic field generator (EXB). Further if the tubular electrode is formed obliquely, even slightly, to the optical axis, this may affect the beam trajectory.

The energy filter illustrated in FIG. 6, for example, is configured to surround the electrode 17, to which negative voltage is applied, with the electrode 26 and the electrode 18 (i.e., an end of the electrode 26 and an end of the electrode 18 are connected, and these two electrodes form an acute angle) instead of the tubular electrode, whereby influences on a beam from the tubular electrode can be suppressed.

In the example of FIG. 6, the electrode 26 and the like making up the energy filter are formed along a virtual line intersecting the beam optical axis, and in order to further improve the resolution of the energy filter, the electrode 26 is desirably placed at a distance r from the deflection fulcrum of the orthogonal electromagnetic field deflector 20. That is, the electrode 26 is desirably formed in parallel to the circle of the radius r about the deflection fulcrum of the orthogonal electromagnetic field deflector 20.

Such a configuration makes the line passing through the deflection fulcrum and the electrode a normal line of the electrode 26, and so energy filtering with high resolution can be performed irrespective of the deflection angle of the orthogonal electromagnetic field deflector 20.

Figure 20:
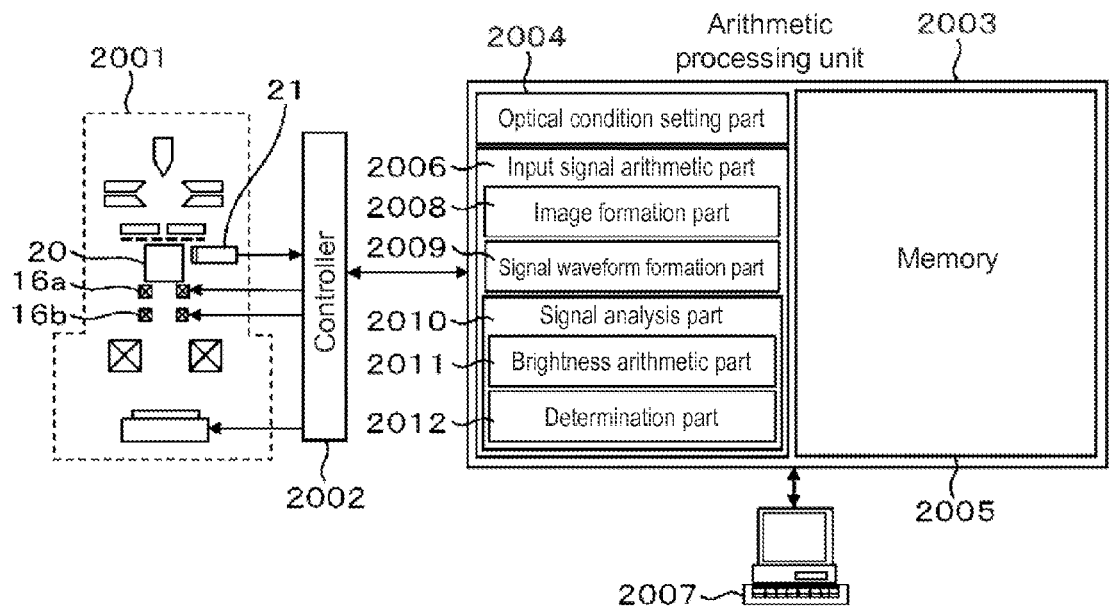
FIG. 20 is the outline of a measurement/examination system including a SEM.

FIG. 20 describes a measurement or examination system including a SEM in details. This system includes a SEM main body 2001, a controller 2002 of the SEM main body and an arithmetic processing unit 2003. The controller 31 of FIG. 1 and various controllers controlled by the controller 31 correspond to the controller 2002.

The arithmetic processing unit 2003 internally includes an optical condition setting part 2004 to supply a predetermined control signal to the controller 2002, a memory 2005 to store acquired image information and recipe information, and an input signal arithmetic part 2006 to process a detection signal acquired by the SEM.

The arithmetic processing unit 2003 is connected to an input device 2007 including input means. A display provided in the input device 2007 displays a GUI (Graphical User Interface), for example, to display an image, an examination result or the like to an operator.

Electrons emitted from a sample are captured by the detector 21, which are then converted into a digital signal by an A/D converter built in the controller 2002. The arithmetic processing unit 2003 internally includes image processing hardware such as a CPU, an ASIC or a FPGA to perform image processing according to a purpose. The input signal arithmetic part 2007 internally includes an image formation part 2008 to form a two-dimensional image by arranging detection signals acquired by the SEM two-dimensionally, a signal waveform formation part 2009 to form a waveform indicating a change in brightness versus positions on a sample based on detection signals or image signals, and a signal analysis part 2010 to analyze the signal waveform formed by the signal waveform formation part 2009.

A part or the whole of the control or the processing by the arithmetic processing unit 2003 may be assigned to an electronic computer or the like including a CPU and a memory capable of storing images for processing and controlling. In the case of this example, the controller 2002 and the arithmetic processing unit 2003 of FIG. 20 function as a control system to control the SEM main body 2001.

Figure 24:
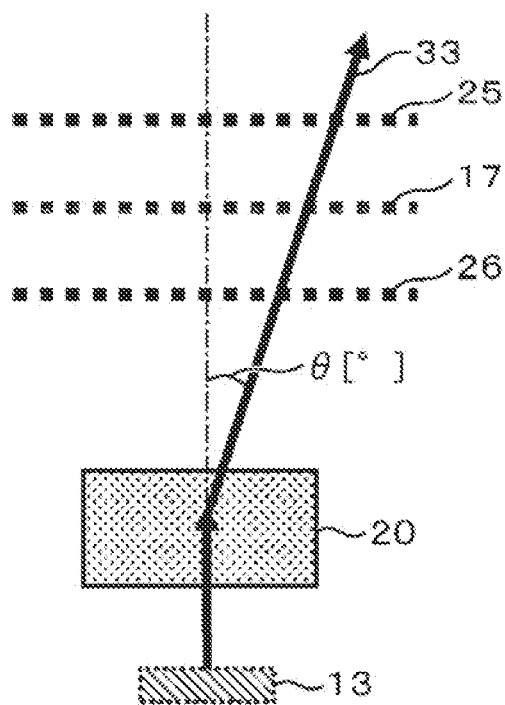
FIG. 24 shows a relationship between deflection by an orthogonal electromagnetic field generator and the incident direction of electrons on an energy filter.
Figure 25:
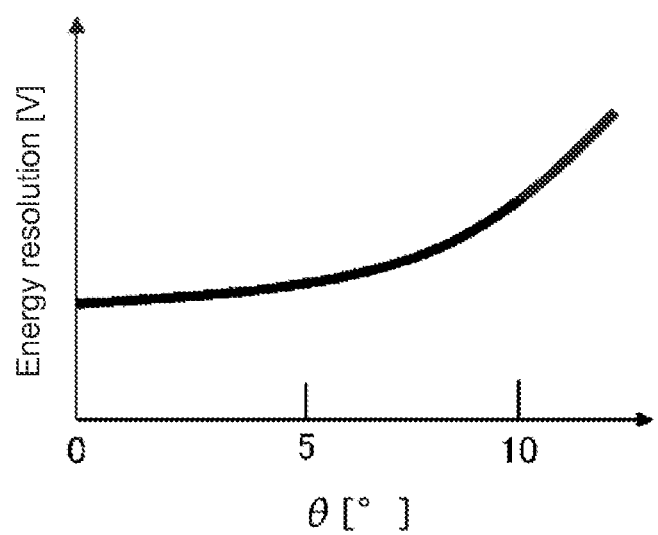
FIG. 25 is a graph showing the relationship between the incident direction of electrons on an energy filter and energy resolution.

As shown in FIG. 24, the incident angle of information signals 33 (e.g., secondary electrons or reflection electrons accelerated by application of retarding voltage to the sample) to the electrodes 17, 25 and 26 making up the energy filter changes with deflection conditions such as of the orthogonal electromagnetic field deflector 20 or the like, and as illustrated in FIG. 25, the resolution of the energy filter changes with the incident angle θ[°] of the information signals 33 to the filter. Although it may change with formation accuracy of the mesh-form electrode, the energy resolution becomes the optimum when the information signals 33 are incident orthogonally to the energy filter part. Therefore, it is necessary to control the deflection angle θ[°] of the information signals 33 by the orthogonal electromagnetic field deflector 20 so as to let the information signals to be incident orthogonally to the energy filter or to yield the optimum resolution.

Figure 26:
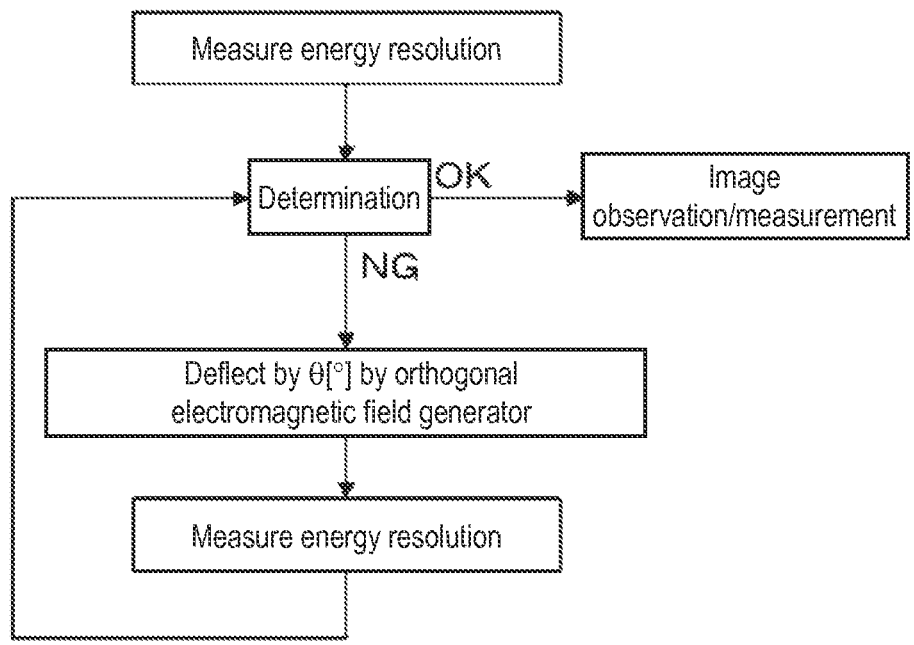
FIG. 26 is a flowchart to show the process to measure energy resolution.
Figure 27:
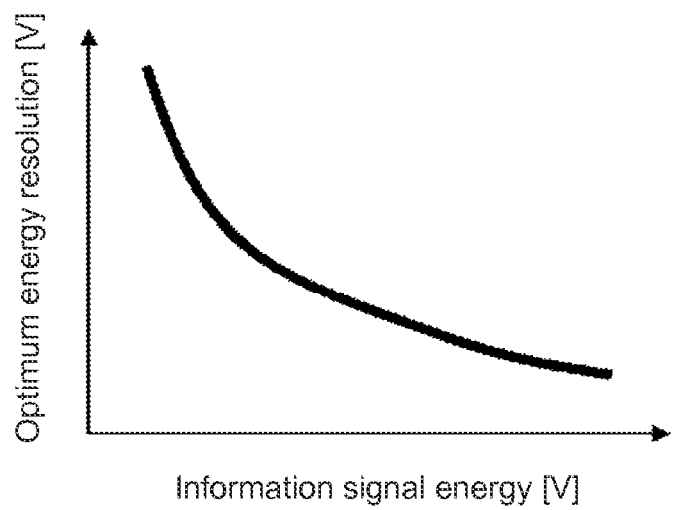
FIG. 27 is a graph showing the relationship between energy of incident electrons and optimum energy resolution.

FIG. 26 is a flowchart to control the orthogonal electromagnetic field deflector 20 for the optimum energy resolution. Firstly, energy resolution is measured. As shown in FIG. 27, for example, the optimum energy resolution depends on the energy of information signals 33. Based on this, determination is made as to whether the measured energy resolution is the optimum or not. When it is the optimum, then observation of an image or measurement thereof is started. When it is not the optimum, the deflection angle θ of the information signals 33 is deflected by the orthogonal electromagnetic field deflector 20, and the energy resolution is measured again. Repeating this process, the deflection angle θ is controlled by the orthogonal electromagnetic field deflector 20 so as to yield the optimum energy resolution.

Figure 28:
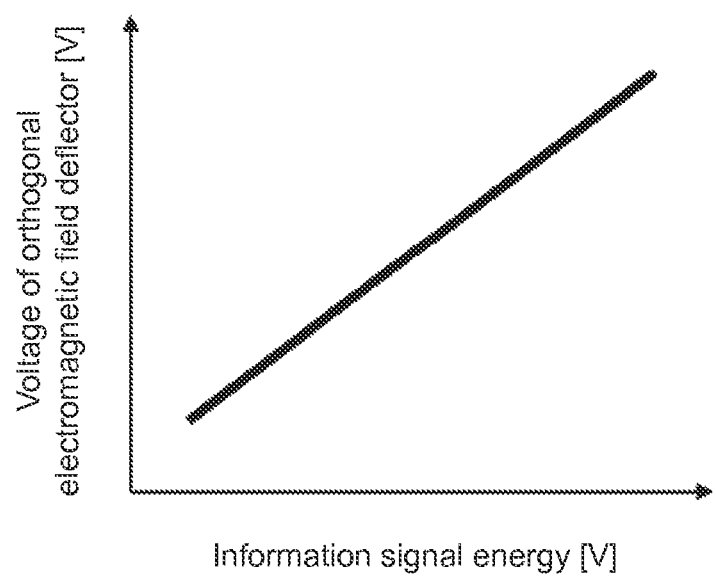
FIG. 28 is a graph showing the relationship between voltage applied to an orthogonal electromagnetic field generator and information signal energy.

The orthogonal electromagnetic field deflector 20 has to be controlled while changing its control value depending on the energy of the information signals 33. FIG. 28 shows a relationship between the energy of information signals and the voltage of the orthogonal electromagnetic field deflector 20. It may be controlled in accordance with an equation that is found by calculation beforehand.

The following specifically describes how to calculate a resolution rating index of the energy filter, which is executed by the arithmetic processing unit 2003. As described above referring to FIG. 22, higher energy resolution enables more precise filtering. The present embodiment defines a value indicating the rank in performance of the energy resolution as a resolution rating index. The following describes how to control the orthogonal electromagnetic field generator based on the calculation of such a resolution rating index, with reference to the flowchart of FIG. 29.

Firstly, the optical condition setting part 2004 sets optical conditions of the SEM (Step 2901). The optical conditions herein refer to device conditions to irradiate a sample with an electron beam, including acceleration voltage of the electron beam, retarding voltage applied to the sample and the like. Next, based on the set optical conditions, a deflection condition of the orthogonal electromagnetic field generator, which is registered in the memory 2005, is set (Step 2902). Under these conditions, rating of the resolution is started. While changing voltage Vf applied to the energy filter, the image formation part 2008 forms an image based on a detection signal for each voltage value (Step 2903). A brightness arithmetic part 2011 calculates brightness (Gray level) of the image based on the formed image (Step 2904). A determination part 2012 calculates ΔVf based on the acquired brightness information, and determines whether the ΔVf satisfies a predetermined condition or not (Step 2905).

Herein, as illustrated in FIG. 22, ΔVf is calculated by finding a variation of Vf corresponding to a predetermined brightness variation (Th(u)–Th(l)). As described before, an energy filter having a smaller variation can be said to have high energy resolution. Therefore ΔVf or a rating value acquired by normalizing ΔVf based on a predetermined condition can be defined as the resolution rating index. The resolution rating index may be found based on the calculation of gradient (ΔG/ΔVf) of a correlation curve between the brightness G and Vf. In this case, it can be said larger gradient means higher resolution.

When it is determined that the resolution rating index satisfies a predetermined condition, such a deflection condition is set as a deflection condition of the orthogonal electromagnetic field generator (Step 2907), and when it is determined that the index does not satisfy the predetermined condition, the setting value of the orthogonal electromagnetic field generator is changed (Step 2906) and by repeating the process of Steps 2902 to 2905, an appropriate deflection condition is selected. When ΔVf is the resolution rating index, if ΔVf is the minimum or less than a predetermined value, the resolution rating index is determined to satisfy a predetermined condition, and thus the deflection condition may be selected. Since a SEM measuring a semiconductor pattern is required to always set a stable measurement condition, a reference value may be set for ΔVf beforehand, for example, and the deflection condition may be selected so that ΔVf becomes the reference value.

Figure 29:
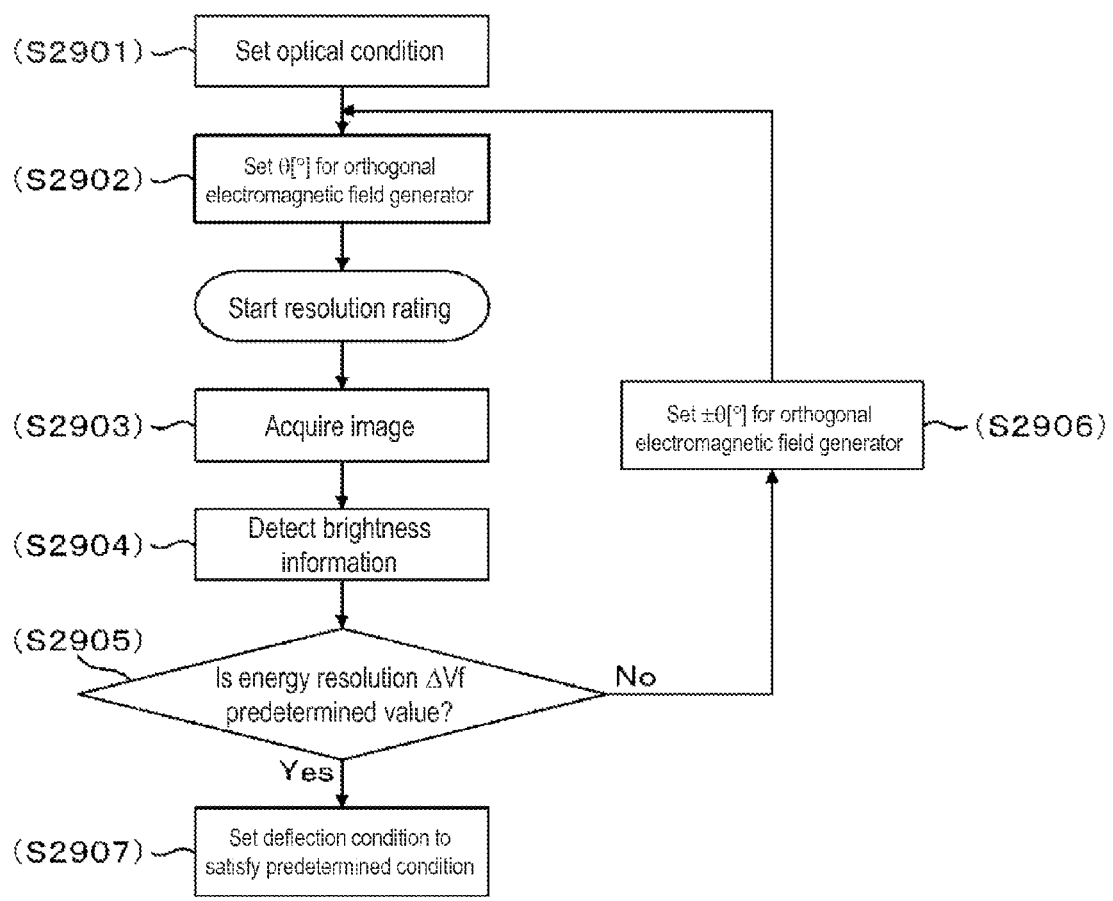
FIG. 29 is a flowchart to show the process to set a deflection condition of an orthogonal electromagnetic field generator based on resolution rating of an energy filter.

Deflection condition may be set based on the process as illustrated in FIG. 29, whereby an appropriate deflection condition can be found, which changes with the charged state of the sample or other fluctuation factors of the trajectory of electrons.

Figure 30:
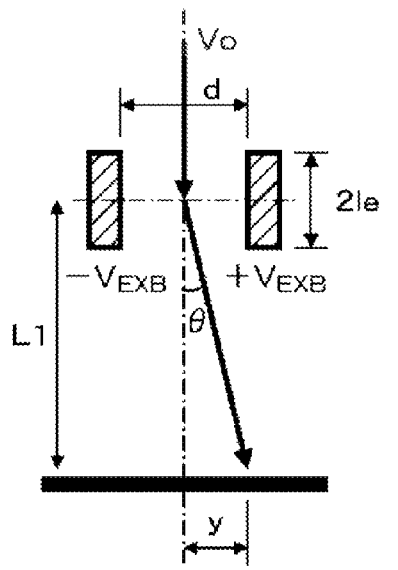
FIG. 30 describes the relationship between electric field and magnetic field of an orthogonal electromagnetic field generator.
Figure 30:
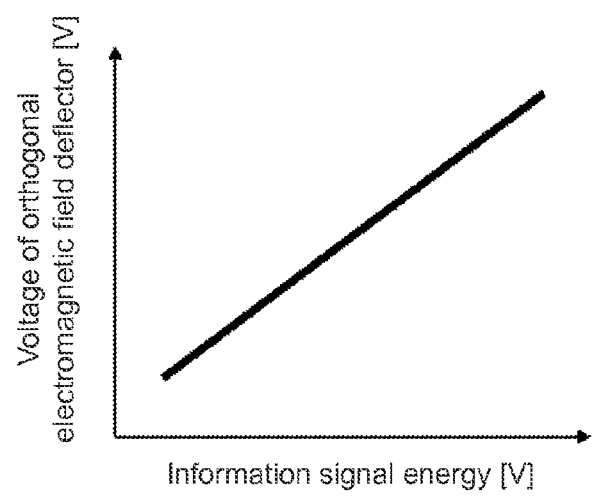
Figure 30:
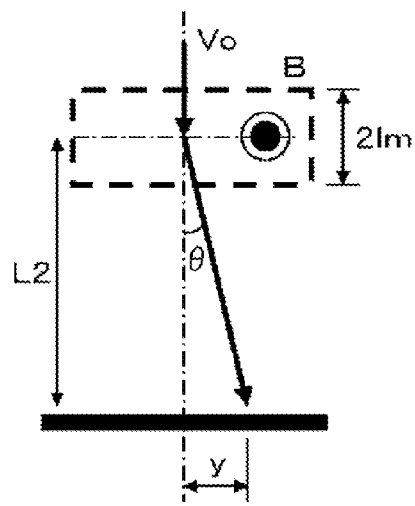

Herein let that the deflection amount by electric field (E) is y in a figure orthogonal electromagnetic field generator, the following equation (2) holds:

[Math. 2]

$$y = \frac{le}{d} \cdot L_1 \cdot \frac{V_{EXB}}{V_o} \quad (2)$$

le: dimension of electrostatic deflector in optical axis direction of the beam
d: distance between electrodes of electrostatic deflector
L1: distance between deflection starting point and position where electrons are deflected by deflection amount y
$V_{EXB}$: voltage applied to electrostatic deflector As illustrated in FIG. 30(*a*), voltage +$V_{EXB}$ and +$V_{EXB}$ are applied to two electrodes making up an electrostatic deflector, respectively, and electrons having negative charge are deflected toward the electrode, to which +$V_{EXB}$ is applied. The bending angle θ of the electrons is represented by equation (3):

[Math. 3]

$$\theta = \frac{le}{d} \cdot \frac{V_{EXB}}{V_o} \quad (3)$$

(Secondary) information signal energy corresponds to Vo, and once the bending angle θ is determined, then voltage ±$V_{EXB}$ to be applied to the electrode can be determined.

The equation relating to the magnetic field B and the deflection amount y of the orthogonal electromagnetic field generator as illustrated in FIG. 30(*b*) is represented by equation (4):

[Math. 4]

$$y = \sqrt{\frac{e}{2m}} \cdot \frac{B}{\sqrt{V_o}} \cdot 2l_B \cdot L_2 \quad (4)$$

Transforming this into the equation for bending angle θ yields the following equation (5):

[Math. 5]

$$\theta = \sqrt{\frac{e}{2m}} \cdot \frac{B}{\sqrt{V_o}} \cdot 2l_B \quad (5)$$

m: mass of electrons (9.1091×10$^{-31}$ kg)
B: charge of electrons (1.6021×10$^{-19}$ C)
$I_B$: magnetic field range These equations are solved to find a condition to deflect not the primary beam but secondary signals (electrons emitted from the sample) only.

Such a condition may be found for each deflection angle θ, whereby a relationship as illustrated in FIG. 30(*c*) between energy of electrons emitted from the sample and voltage (current) applied to the deflector can be found, whereby a condition in accordance with deflection angles of secondary signals so as not to deflect the primary beam can be found. Such a condition is registered in the memory 2005, and is set by the optical condition setting part 2004 as a control signal to the orthogonal electromagnetic field generator.

FIG. 29 describes the example where, in order to find a resolution rating index for each of a plurality of deflection angles, voltage Vf applied to the energy filter is changed to detect the correlation curve (S curve) between brightness and Vf for each deflection angle. Herein, the S curve may be formed by changing the optical condition.

Note here that since the optical condition of the electron beam (primary electrons) does not change regardless of a change in Vf, it is desirable to find energy resolution by changing Vf when the optical condition is not to be changed. Meanwhile, the S curve acquired by changing the optical condition (e.g., retarding voltage: Vr) will be shifted to the side of +Vr or −Vr by the amount corresponding to charge attached to the sample on the plot of the brightness versus Vr correlation curve. That is, if a S curve in the absence of charge is known, the shift amount may be found, whereby the amount of change can be measured. $V_{EXB}$ may be found based on the measurement of such an amount of charge, whereby appropriate deflection intensity can be found. In this case, a reference S curve may be registered in the memory 2005 beforehand, a shift amount may be found by the signal analysis part 2010, and then the optical condition setting part 2004 may calculate $V_{EXB}$. According to the example described later, the deflection amount corresponding to an amount of charge can be found.

Figure 16:
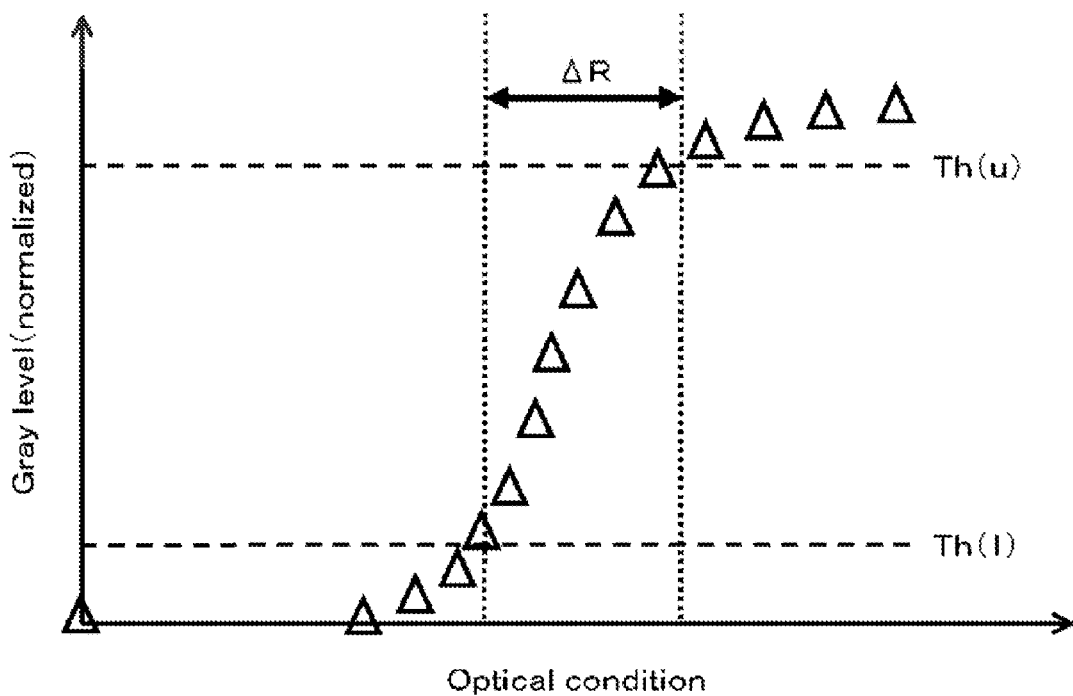
FIG. 16 shows a change of brightness with the change in optical condition in a SEM.

For instance, as illustrated in FIG. 16, as the optical condition (e.g., acceleration voltage of an electron beam, negative voltage applied to a sample (retarding voltage), or both of them) is changed, the brightness value is shifted. When the optical condition is retarding voltage, for example, as the retarding voltage is increased gradually, the number of electrons passing through the energy filter increases, and so the brightness value increases.

As described before, a steeper change of this means higher energy resolution. Therefore a resolution rating index may be used as an index to find this condition. In the example of FIG. 16, a variation (ΔR) of retarding voltage corresponding to a predetermined variation of brightness (Th(u)−Th(l)) or an index value of such a rating amount is used as the resolution rating index. Referring to the flowchart illustrated in FIG. 17, the following describes the procedure to set a device condition of a SEM for a more precise or more stable energy filter based on this rating index.

The present example describes to improve or stabilize the energy resolution of an energy filter by adjusting the deflection condition of the orthogonal electromagnetic field deflector 20 illustrated in FIG. 2 or FIG. 3, for example. Firstly, a predetermined condition is set for the orthogonal electromagnetic field deflector 20 (Step 1701). In this state, the optical condition (e.g., retarding voltage applied) is set at a predetermined condition (Step 1702), and electrons emitted from a sample at this time are detected by the detector 21, whereby an image thereof is acquired (Step 1703). Brightness information is extracted from this image, which is stored in a storage medium such as the memory 2005 (Step 1704). The processing from Step 1701 to Step 1704 is performed for each of a plurality of conditions to apply retarding voltage, whereby the relationship between the optical condition and the brightness condition as illustrated in FIG. 16 is found (Step 1705). Although the present example describes brightness found for a predetermined number of optical conditions, detection of the brightness information may be stopped when ΔR is detected.

The processing from Step 1701 to Step 1705 is performed for a plurality of deflection conditions of the orthogonal electromagnetic field deflector 20 (Step 1706). Then, ΔR is acquired for each of the plurality of deflection conditions, and the deflection condition of the orthogonal electromagnetic field deflector 20 is set based on the plurality of ΔRs (Step 1707). Herein, in order to operate an energy filter in the highest energy resolution state, the deflection condition to be selected is to minimize ΔR. Meanwhile, since a SEM measuring a semiconductor pattern is required to always set a stable measurement condition, a reference value may be set for ΔR beforehand, for example, and the deflection condition may be selected so that ΔR becomes the reference value.

Figure 17:
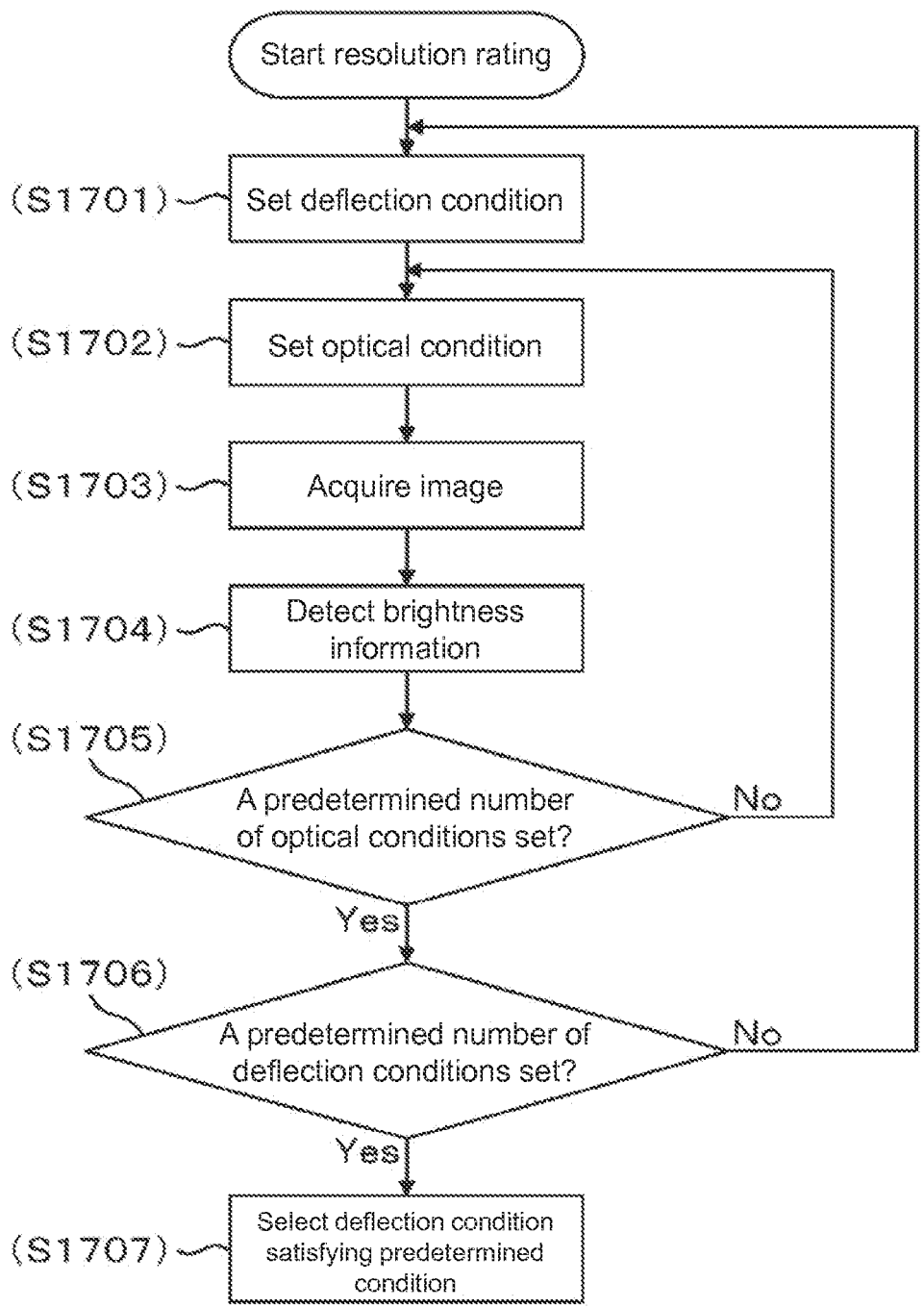
FIG. 17 is a flowchart to show the process to set a deflection condition of an orthogonal electromagnetic field generator based on the resolution rating of an energy filter.
Figure 18:
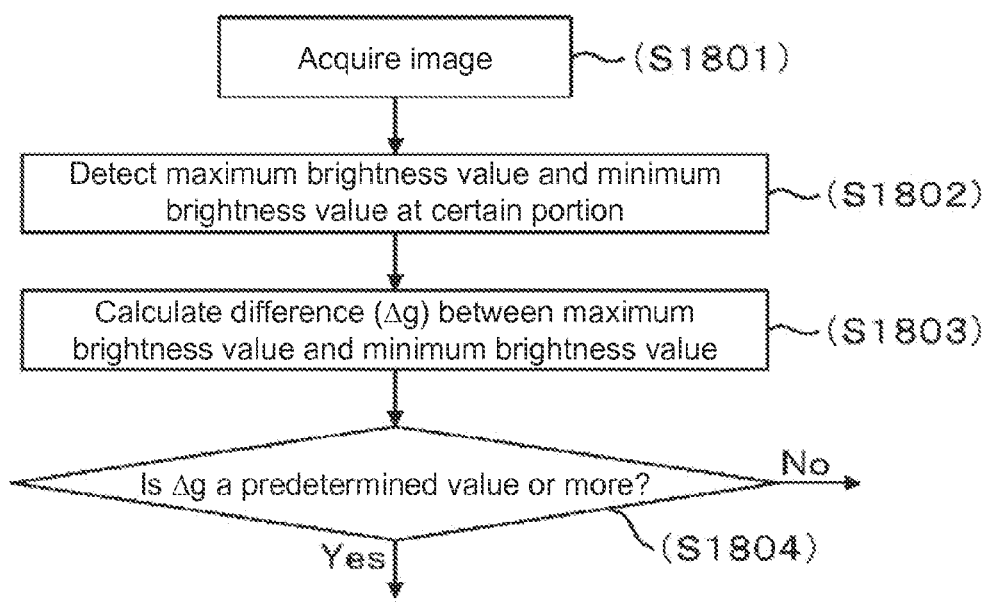
FIG. 18 is a flowchart to show the process to calculate a difference in brightness between two parts.
Figure 19:
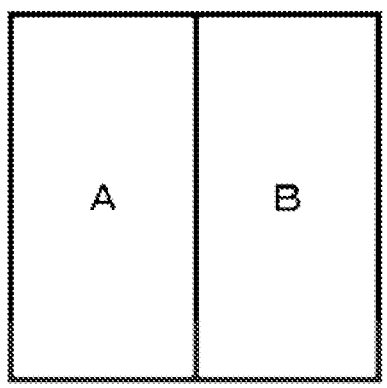
FIG. 19 shows a change in brightness difference between two parts when energy filtering is performed correctly and when energy filtering is not performed correctly.
Figure 19:
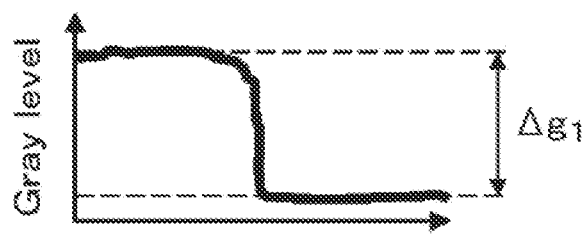
Figure 19:
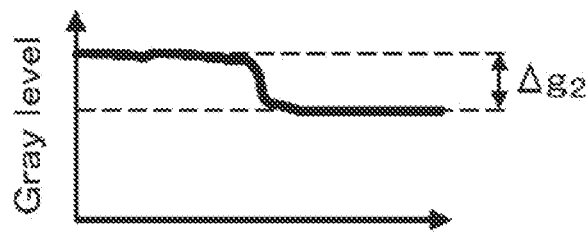

The flowchart illustrated in FIG. 29 describes the example of finding ΔVf for each deflection condition of the orthogonal electromagnetic field deflector 20, and the flowchart illustrated in FIG. 17 describes the example of finding ΔR for each deflection condition of the orthogonal electromagnetic field deflector 20. As illustrated in FIG. 19, for example, in the case where a sample including two or more type of materials exists in the field of view (FOV) of the SEM, and when correctly performed energy filtering shows clear contrast between the two types of materials, an appropriate deflection condition may be found based on the contrast between them. The following describes such an example. FIG. 18 shows the procedure to find a deflection condition of the orthogonal electromagnetic field deflector 20 based on the contrast of an image. In the present example, Steps 1801 to 1804 are used instead of Step 2903 to Step 2905 of FIG. 29.

After setting the deflection condition of the orthogonal electromagnetic field deflector 20 at a predetermined condition, an image is acquired (Step 1801), and a maximum brightness value and a minimum brightness value are detected at a region across a material A (region A) and a material B (region B) (Step 1802). At this time, when appropriate voltage is applied to the energy filter and the deflection condition of the orthogonal electromagnetic field deflector 20 is appropriate, then as illustrated in FIG. 19(*b*), a difference in brightness between region A and region B becomes clear. On the other hand, when the deflection condition of the orthogonal electromagnetic field deflector 20 is not appropriate, so that the energy resolution deteriorates, then energy filtering is not performed correctly, and as illustrated in FIG. 19(*c*), for example, contrast between the two regions may deteriorate so that there is little difference in brightness therebetween.

Then, in the present embodiment, a difference in brightness between two regions (Δg) is calculated (Step 1803), and determination is made whether the deflection condition has the largest difference in brightness, i.e., Δg satisfies a predetermined condition or not (Step 1804). When Δg is a predetermined value or more or satisfies the predetermined condition, it is determined that the orthogonal electromagnetic field generator is controlled correctly, and such a deflection condition is selected (Step 2907). When the predetermined condition is not satisfied or when a predetermined condition is not set, a condition of the orthogonal electromagnetic field generator is newly set, and the processing from Steps 1801 to 1804 is executed again. The selected deflection condition is registered in the memory 2005 or the like as a device condition.

Such a configuration enables selection of an appropriate deflection condition when a desired target is to be measured based on clear contrast between two or more regions. The determination whether a difference in brightness satisfies a predetermined condition or not may be performed based on the determination whether it exceeds a predetermined threshold or not, or based on the determination whether a ratio between two brightness values is at a predetermined value, less than a predetermined value or a predetermined value or more or not. These values of a difference in brightness, a brightness ratio and their index values may be used as resolution rating indexes, whereby a device condition for target measurement or examination can be rated correctly. Since a steeper change in brightness means higher energy resolution, a change in brightness may be fitted with an approximate function to find the degree of gradient, and the resultant may be defined as a resolution rating index. The brightness arithmetic part 2011 and the determination part 2012 included in the signal analysis part 2009 execute these brightness calculation and determination operations.

Figure 14:
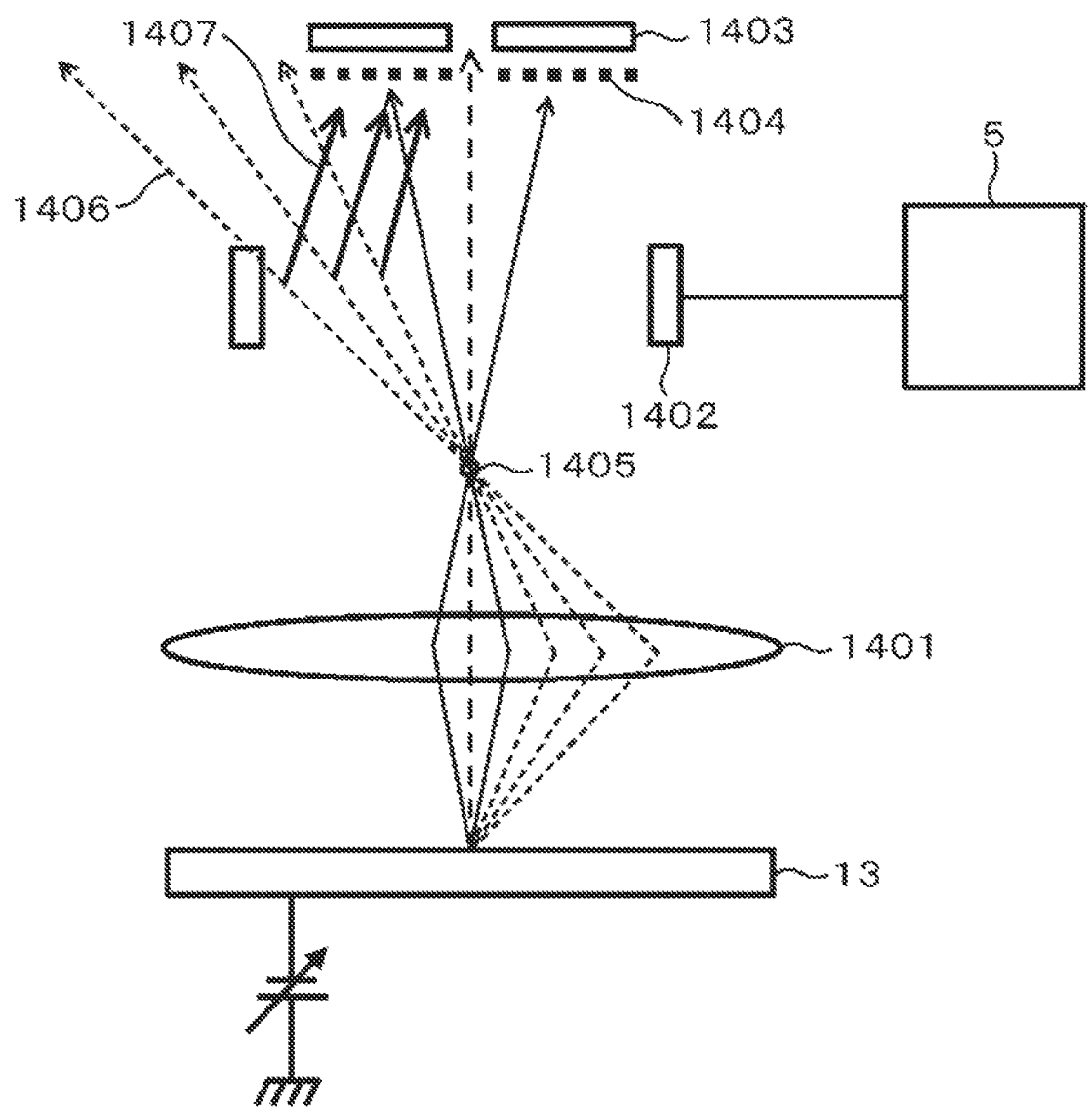
FIG. 14 shows an exemplary SEM including a focusing element to focus electrons emitted from a sample.

That is a description about the example where a deflector (in the above examples, the orthogonal electromagnetic field deflector 20) to deflect secondary electrons or the like toward a detector is set based on a resolution rating index. The following describes an example where a focusing element to focus electrons emitted from a sample is used to deflect the trajectory of the electrons, thereby setting an appropriate device condition. FIG. 14 shows the trajectory of electrons 1406 emitted from a sample. Electrons emitted from the sample 13 are focused by an objective lens, pass through a crossover point 1405, and travel upward (toward an electron source). A part of the electrons 1406 emitted from the sample are directed to a deflector 1403 via an energy filter 1404, and the other electrons are directed in a direction different from the detector 1403 and are not detected. The present example describes a device configuration capable of improving the detection efficiency of electrons detected and performing precise energy filtering while keeping high detection efficiency.

The SEM illustrated in FIG. 14 includes a focusing electrode 1402 as a deflecting element to deflect the trajectory of electrons emitted from the sample. Voltage is applied to this focusing electrode 1402 from the lens control power supply 5, for example, whereby electrons can be oriented toward the detector 1403 as in electrons 1407 in the deflected trajectory. The detector 1403 may be configured to directly detect electrons like a Micro Channel Plate (MCP) detector, or the detector 1403 may be a conversion electrode and another detector may be separately provided to detect secondary electrons generated from the conversion electrode.

Figure 15:
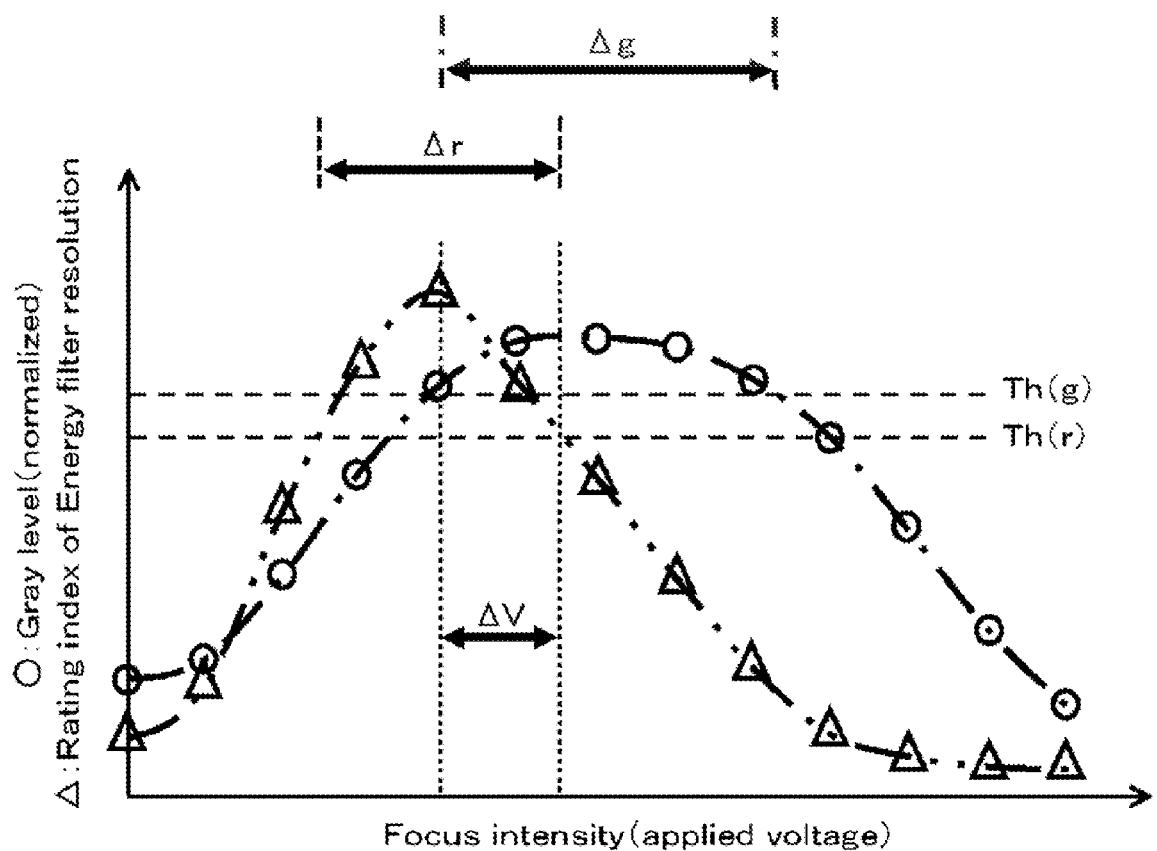
FIG. 15 shows a change of brightness and resolution rating index with the change in focusing condition of a focusing element to focus electrons emitted from a sample.
Figure 21:
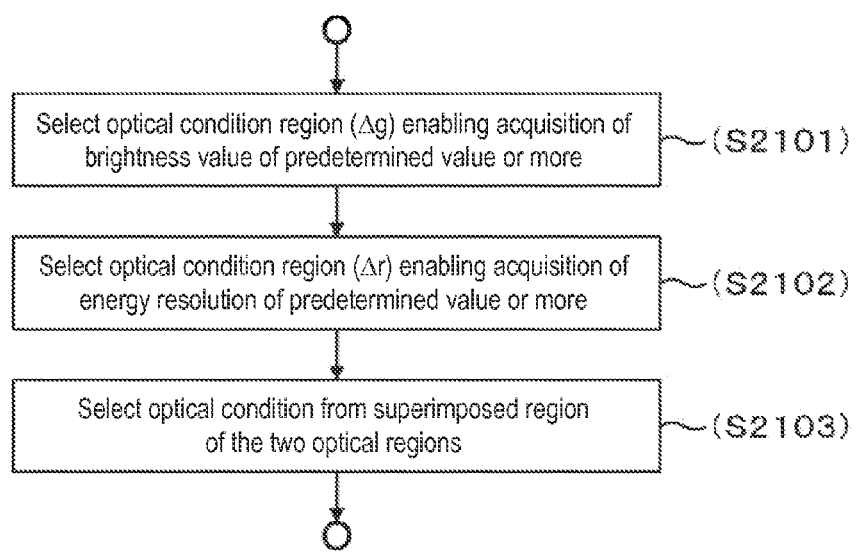
FIG. 21 is a flowchart to show the process to select voltage applied to a focusing electrode by finding a change of brightness and a change of resolution rating index.

FIG. 15 shows a change in brightness value and a change in resolution rating index when voltage applied to the focusing electrode is changed. FIG. 21 is a flowchart to describe the procedure to find such a change in brightness value and a change in resolution rating index, thus selecting voltage applied to the focusing electrode 1402. In this example, a brightness value and a resolution rating index are found for each voltage applied to the focusing electrode 1402, whereby two curves are created. Then, two thresholds (Th(g), Th(r)) are set, and the ranges (Δg, Δr) of applied voltage exceeding the thresholds of the two curves are selected (Steps 2101, 2102). In the present example, the applied voltage included in a superimposed region (ΔV) of Δg and Δr is selected as the voltage to be applied to the focusing electrode 1402 (Step 2103). The region of applied voltage as Δg is a region where the amount of electrons detected is a predetermined value or more, and the region of applied voltage as Δr is a region having high energy resolution. Voltage included in the superimposed region of these two applied voltage regions is selected, whereby both of the high-efficiency detection of electrons and correct filtering condition for energy filter can be achieved. Such processing is performed by the signal analysis part 2010.

Figure 23:
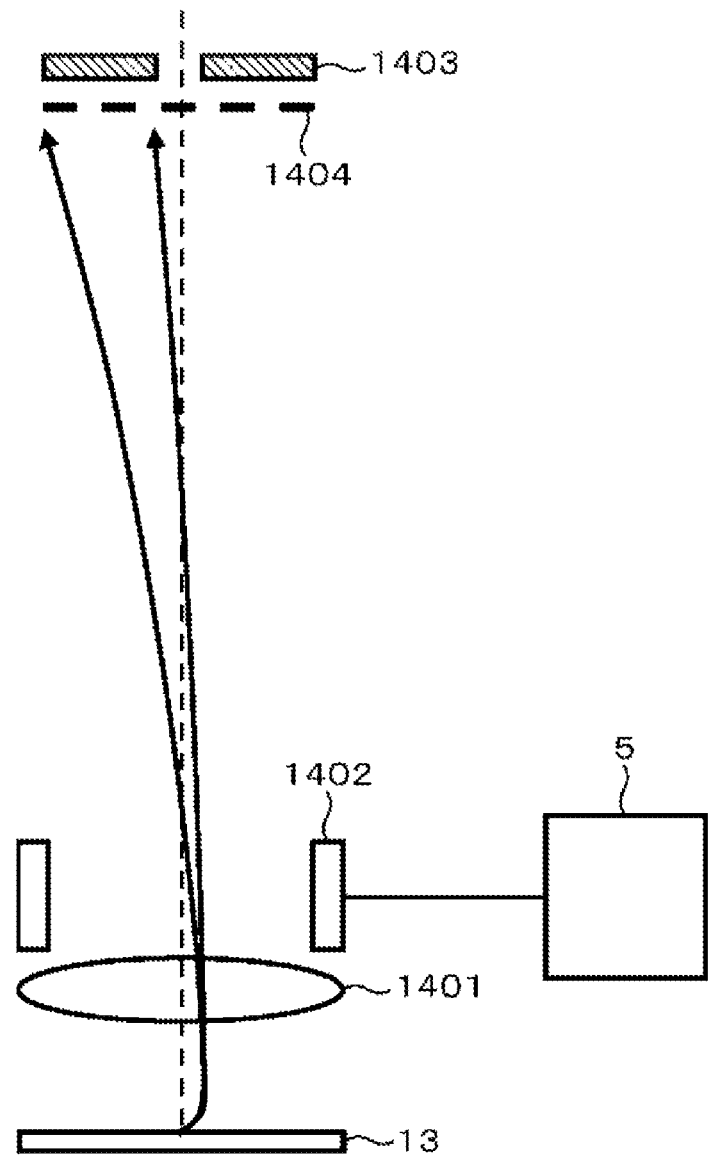
FIG. 23 shows an exemplary electronic optical system.

Unlike FIG. 14, FIG. 23 shows an optical system that does not form a crossover point 1405 between an objective lens 1401 and the deflector 1403. In such an optical system also, similarly to the optical system of FIG. 14, both of high-efficiency detection of electrons and correct filtering condition for energy filter can be achieved based on correct setting of the focusing electrode 1402.

Figure 31:
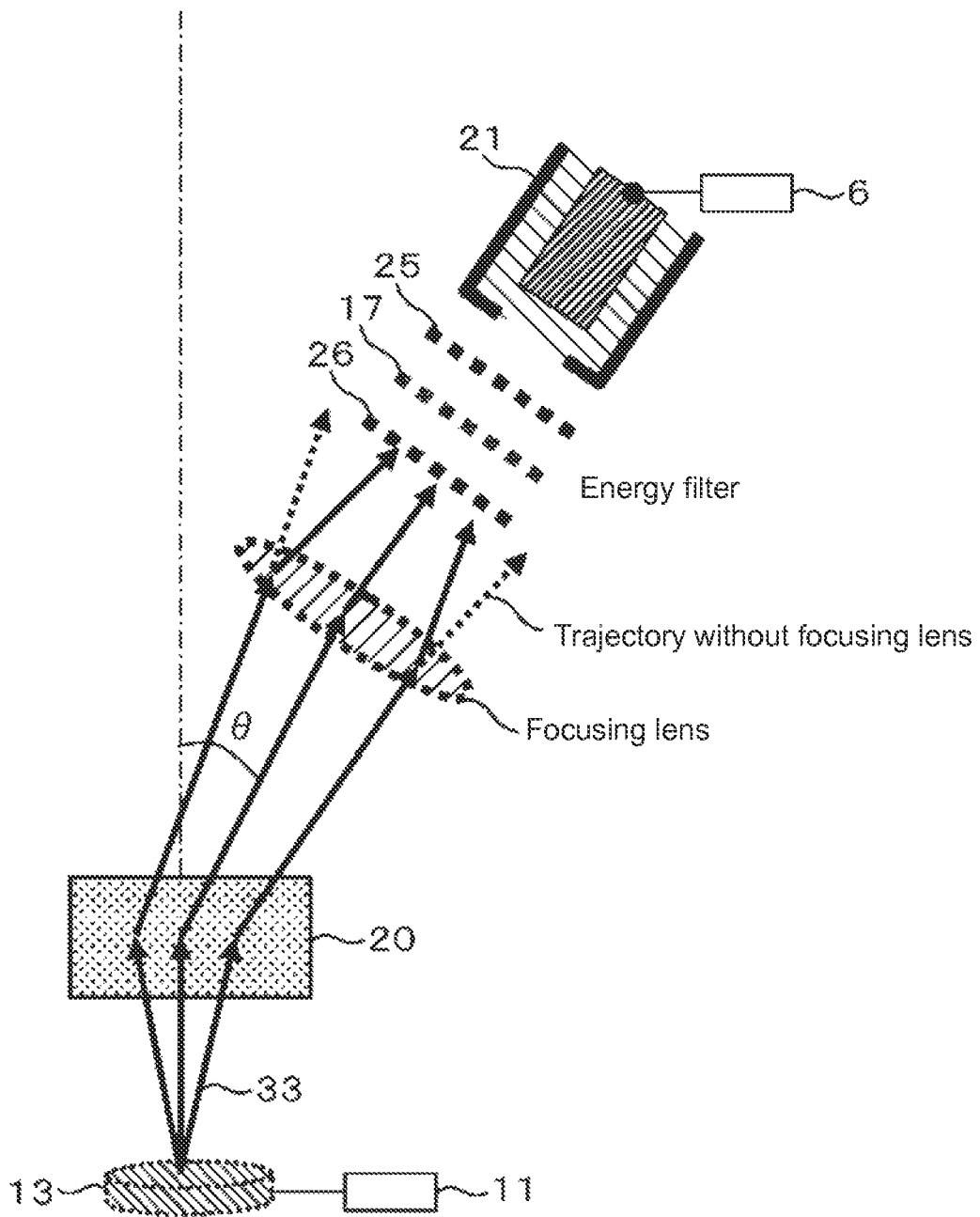
FIG. 31 shows a detection system of a SEM equipped with a focusing lens to focus electrons that are deflected by an orthogonal electromagnetic field generator.

FIG. 31 shows an example of a SEM configured to deflect information signals 33 (secondary electrons or the like) off the axis from a beam (optical axis of the primary beam that is not deflected: ideal optical axis) by an orthogonal electromagnetic field deflector 20, and including a detection system provided with an energy filter and a detector 21 along the deflection trajectory, in which a focusing lens is provided to improve the detection efficiency of electrons. Information signals 33 emitted from a sample and deflected off the axis by the orthogonal electromagnetic field deflector 20 are dispersed as illustrated in FIG. 31. Since the detection plane of the deflector placed in a vacuum vessel has a finite size, larger dispersion means deterioration in defection efficiency.

Figure 32:
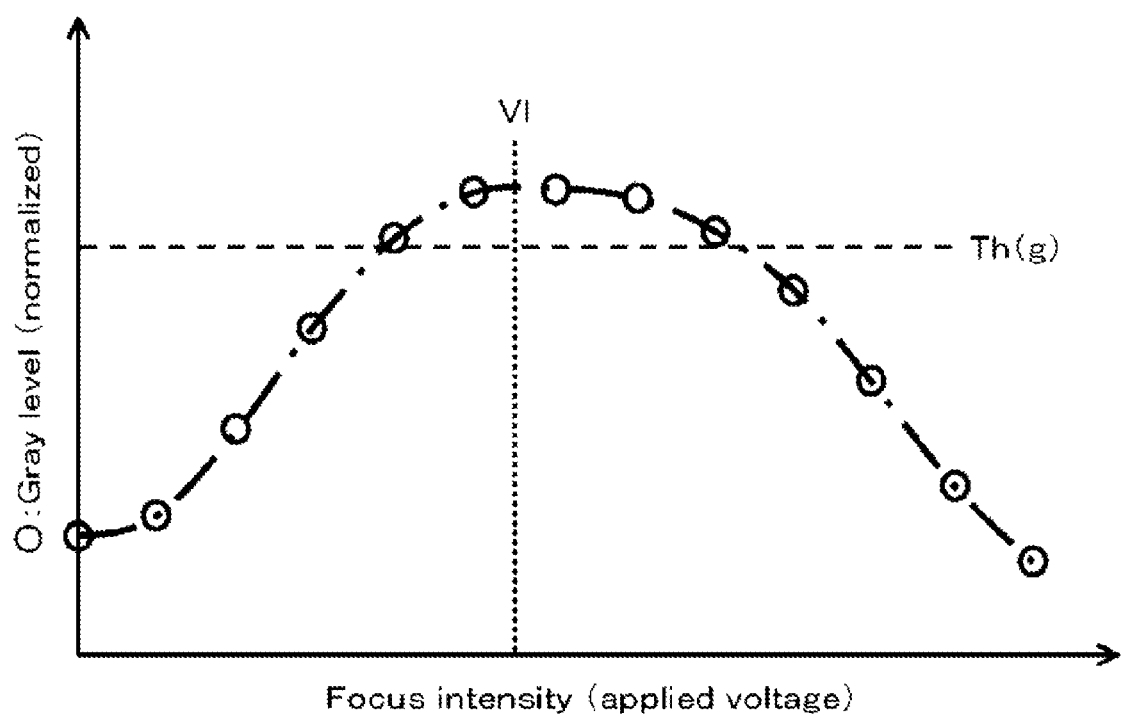
FIG. 32 shows the relationship between focusing lens intensity and brightness values.
Figure 33:
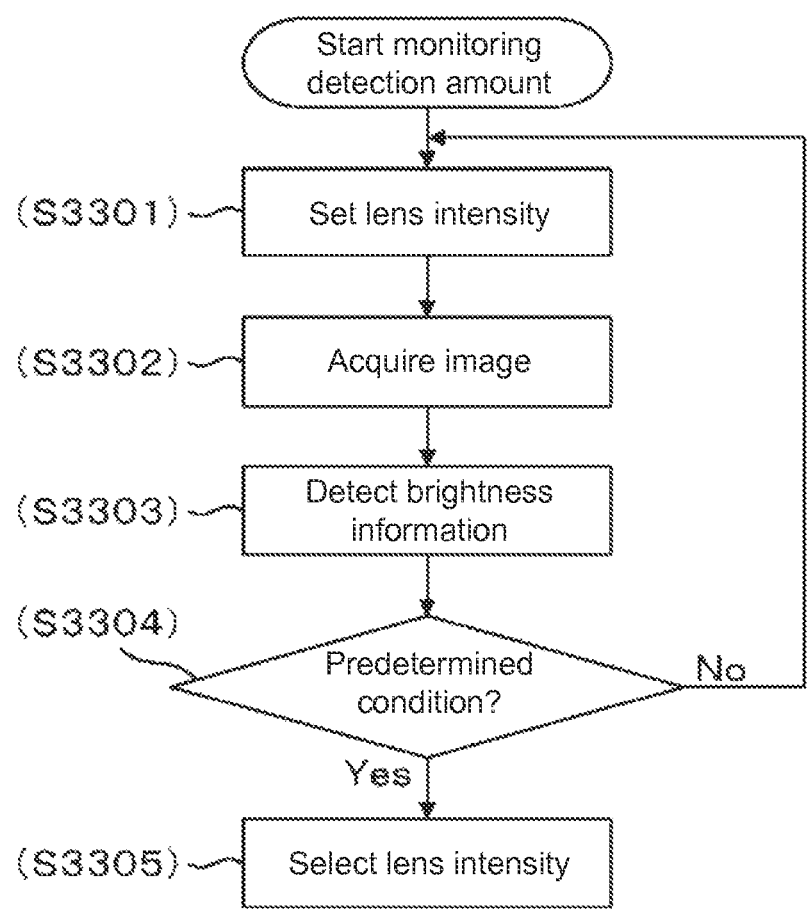
FIG. 33 is a flowchart to show the process to select a lens condition to improve detection efficiency of electrons.

Then the present example describes a method to place the focusing lens between the orthogonal electromagnetic field deflector 20 and a detector 25 to control the trajectory of information signals for improved detection efficiency. As illustrated in FIG. 31, without a focusing action by a focusing lens (e.g., electrostatic lens), some electrons emitted from the sample to be separated from the ideal optical axis may be directed in a direction different from the position of the detector. Such electrons may be deflected toward the detector by the focusing action by a focusing lens, whereby detection efficiency can be improved. FIG. 33 is a flowchart of the procedure to determine a focusing condition of a focusing lens. In this flowchart, an image is acquired for each of set lens intensities set at Step 3301 (Step 3302), and brightness information is extracted from the image. Then, when the detected information satisfies a predetermined condition (e.g., a brightness value is the highest or at a predetermined value), the corresponding lens intensity is selected as a device condition. When the predetermined condition is not satisfied, the lens intensity is set again, and the process from Steps 3301 to 3304 is repeated. At Step 3305, as illustrated in FIG. 32, lens intensity (in the present example, a voltage value applied to the electrostatic lens) corresponding to the maximum brightness value or lens intensity corresponding to a predetermined brightness value (in the present example, the brightness value of Th(g) or more) is selected as a lens condition.

Through this process, a lens condition is determined, whereby an optical condition for a detection system enabling efficient detection can be set.

Figure 34:
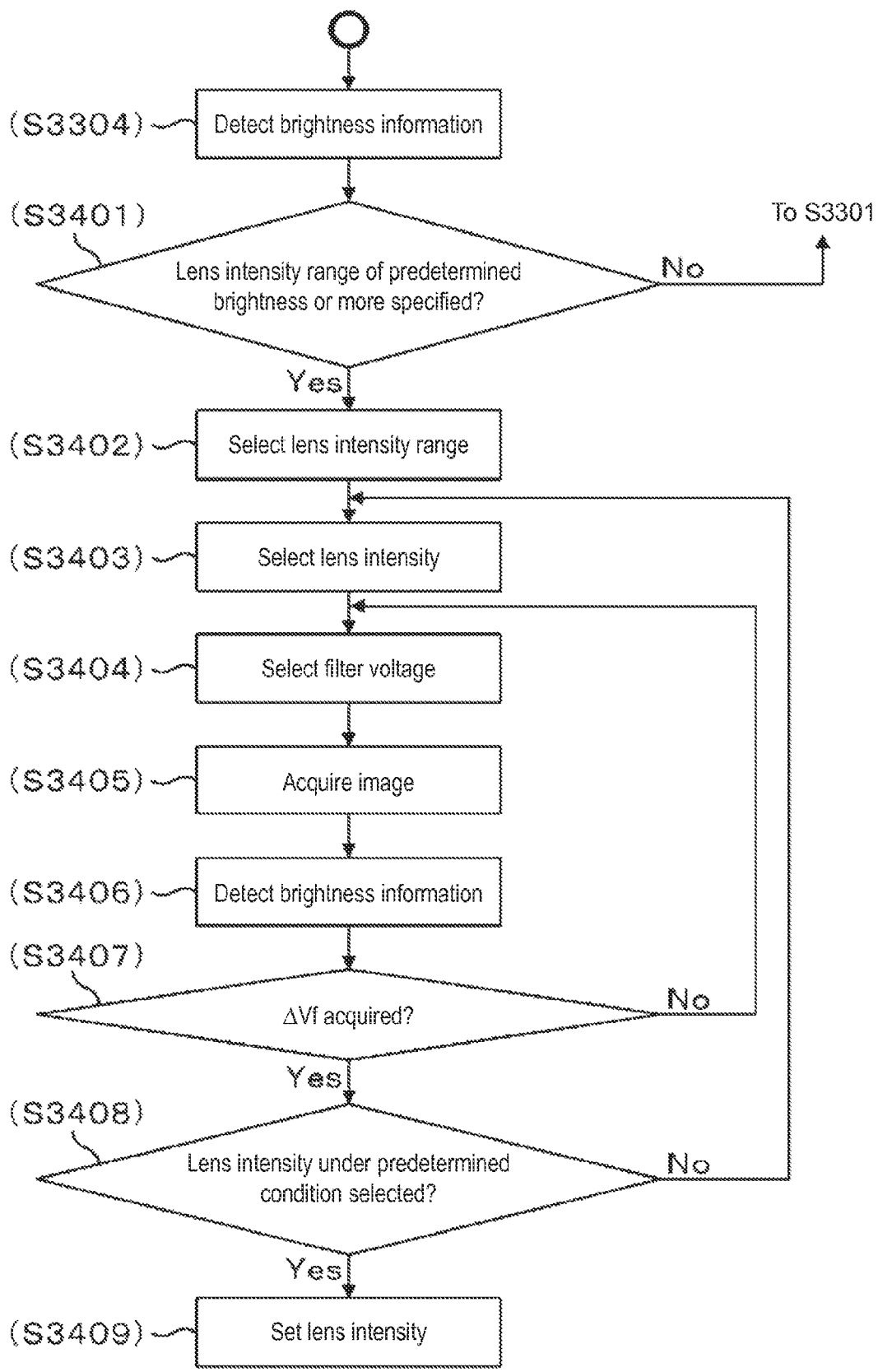
FIG. 34 is a flowchart to show the process to select a lens condition to improve energy resolution of an energy filter.

For detection of electrons by energy filtering, higher detection efficiency is not always favorable. For instance, when the power of the focusing lens is increased (opening angle of a beam becomes larger), electrons will be incident on the electrode plane of the energy filter obliquely, which may degrade energy resolution. Then, the following proposes a method to find a lens condition having high energy resolution in the range of lens conditions capable of yielding a predetermined detection amount. FIG. 34 is a flowchart of such procedure. In the detection procedure of FIG. 33, when a lens condition indicating a predetermined value (e.g., Th(g)) or more of the brightness value is found, an appropriate lens power is selected from the range including such lens power. To this end, a S curve as illustrated in FIG. 22 is formed for a plurality of lens conditions, thus finding ΔVf (Steps 3402 to 3407).

Herein, lens power satisfying the minimum value or a predetermined condition is selected as a lens condition from the plurality of values of ΔVf (Step 3409).

Such a configuration can realize a sufficient detection amount of electrons and can improve energy resolution of the energy filter. When it is understood beforehand that a sufficient detection amount of electrons can be realized, the resolution of the energy filter only can be rated, whereby a lens condition may be determined.

The electrode forming the energy filter illustrated in FIG. 31 may be formed in parallel to the circle of the radius r about the deflection fulcrum of the orthogonal electromagnetic field deflector 20, whereby energy resolution can be further improved.

REFERENCE SIGNS LIST

1 Electron gun
2 Electron source
3 Extraction electrode
4 Acceleration electrode
5 Lens control power supply
6 Electric field controller
7, 8 Focusing lens
9 Objective lens
10 Crossover
11 Measurement device for position monitoring
12 Sample stage
13 Sample
14 Variable deceleration power supply
15 Aperture
16a, 16b Deflector
17, 18 Electrode
19 Voltage controller
20 Orthogonal electromagnetic field deflector
21 Detector
22, 31, 41 Controller
23 Stage driver
24 Scanning signal generator
27 Storage part
32 Image display
33, 34 Information signal
36 Electron beam
37 Image processing part
40 Astigmatism corrector
43 Optical axis
44 Irradiation area

The invention claimed is:

1. A charged particle beam device, comprising a charged particle source; a detector to detect charged particles acquired based on irradiation of a sample with a beam emitted from the charged particle source; and an energy filter to perform energy filtering of charged particles emitted from the sample, wherein
   the charged particle beam device further comprises a first deflecting element to deflect charged particles emitted from the sample so as to separate the charged particles away from an optical axis of the beam emitted from the charged particle source, and
   the energy filter comprises a first filter electrode including a plurality of annular electrodes to which different voltages can be separately applied.

2. The charged particle beam device according to claim 1, further comprising a controller to apply voltages to the annular electrodes such that charged particles following a specific trajectory among the charged particles deflected by the first deflecting element are allowed to selectively pass through the energy filter.

3. The charged particle beam device according to claim 2, wherein the controller applies voltages to annular electrodes positioned along the specific trajectory such that charged particles having energy of a specific value are allowed to pass through the energy filter, or the controller applies voltages to annular electrodes which are at earth potential and which are not positioned along the specific trajectory such that the charged particles having energy of a specific value are filtered through the energy filter.

4. The charged particle beam device according to claim 1, wherein a mesh-form second filter electrode and a mesh-form third filter electrode are arranged such that the first filter electrode is sandwiched therebetween.

* * * * *